(12) United States Patent
Park et al.

(10) Patent No.: US 8,456,018 B2
(45) Date of Patent: Jun. 4, 2013

(54) SEMICONDUCTOR PACKAGES

(75) Inventors: Sangwook Park, Hwaseong-si (KR); Jonggi Lee, Yongin-si (KR); Wonchul Lim, Asan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/275,074

(22) Filed: Oct. 17, 2011

(65) Prior Publication Data

US 2012/0104625 A1   May 3, 2012

(30) Foreign Application Priority Data

Nov. 1, 2010 (KR) .................. 10-2010-0107831

(51) Int. Cl.
*H01L 29/40* (2006.01)
(52) U.S. Cl.
USPC ............. 257/774; 257/E23.067; 257/E23.069
(58) Field of Classification Search
CPC ........ H01L 23/5226; H01L 2924/01078; H01L 2924/01079
USPC ................... 257/738, 774, E23.067, E23.069
See application file for complete search history.

(56) References Cited

U.S. PATENT DOCUMENTS

| 2007/0126030 A1 | 6/2007 | Ito |
| 2009/0020864 A1 | 1/2009 | Pu et al. |
| 2009/0170241 A1 | 7/2009 | Shim et al. |
| 2010/0096754 A1* | 4/2010 | Lee et al. ............. 257/738 |

FOREIGN PATENT DOCUMENTS

| JP | 2007-157879 | 6/2007 |
| KR | 1020070058349 | 8/2007 |
| KR | 1020090071365 | 7/2009 |

* cited by examiner

*Primary Examiner* — Nikolay Yushin
(74) *Attorney, Agent, or Firm* — F. Chau & Associates, LLC

(57) ABSTRACT

Provided are a semiconductor package and a method of fabricating the same. The semiconductor package includes a semiconductor chip having a bonding pad, a metal line electrically connected to the semiconductor chip and having a terminal contacting an external terminal, an insulation layer covering the metal line and having an opening that defines the terminal, and a molding layer molding the semiconductor chip, wherein the molding layer includes a recess pattern exposing the bonding pad and extending from the bonding pad to the terminal, and the metal line is embedded in the recess pattern to contact the bonding pad.

12 Claims, 41 Drawing Sheets

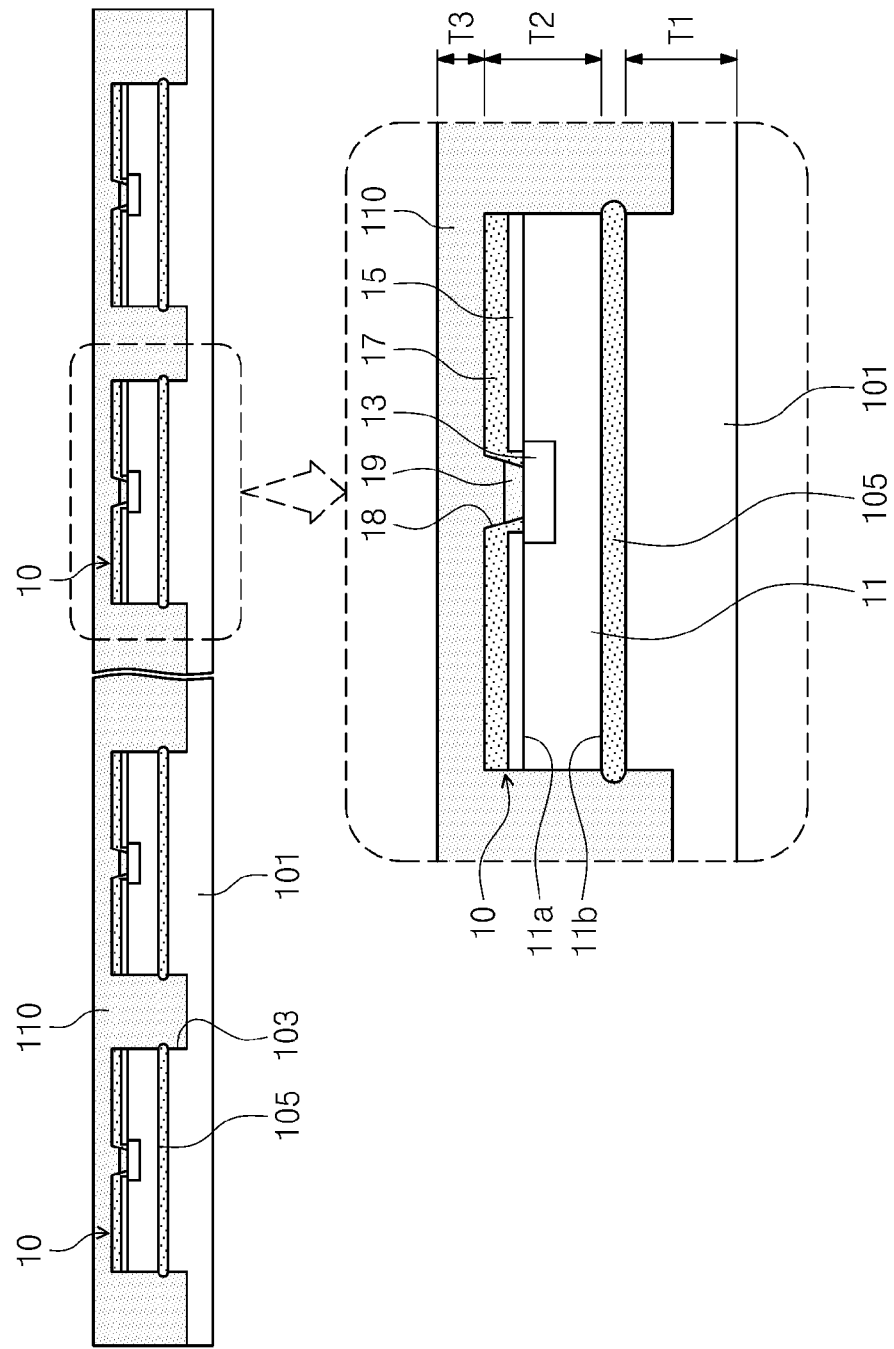

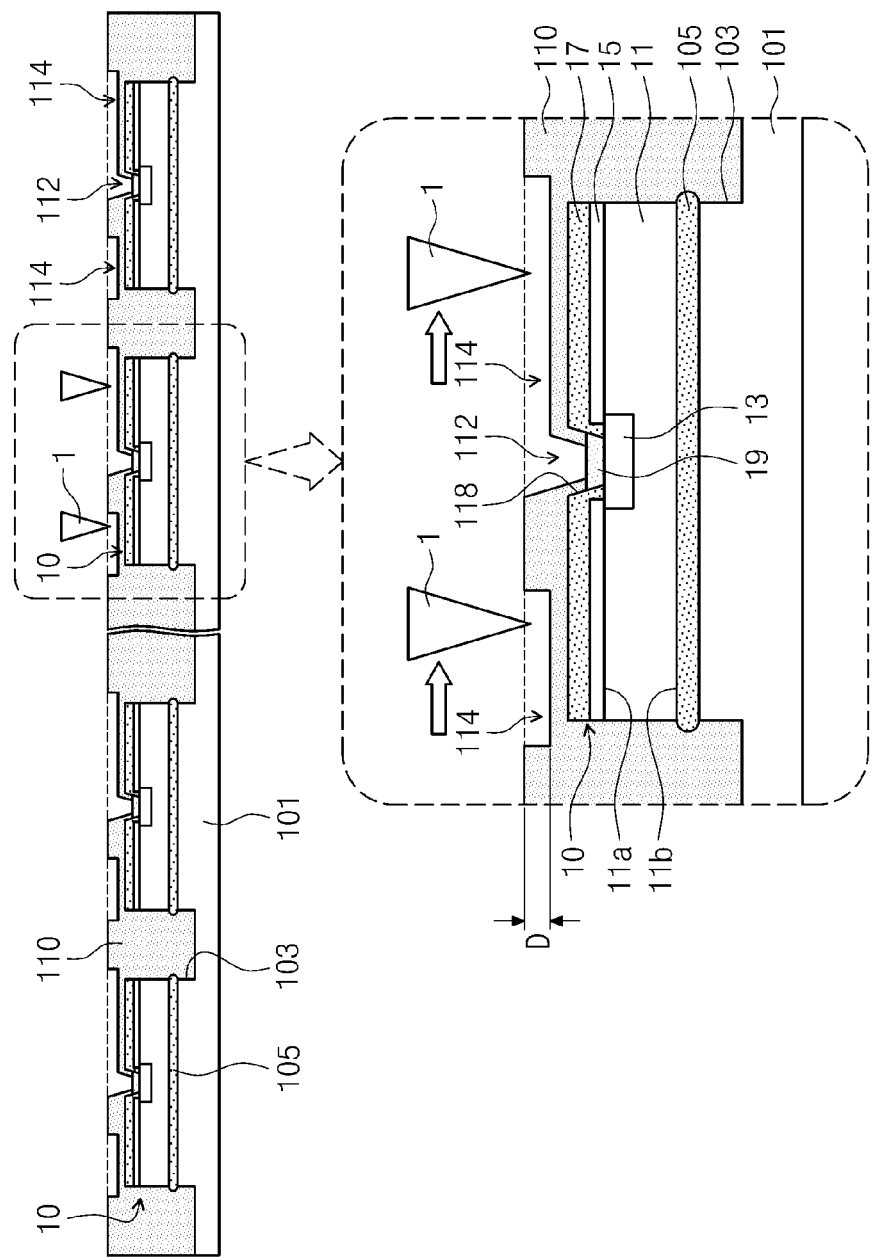

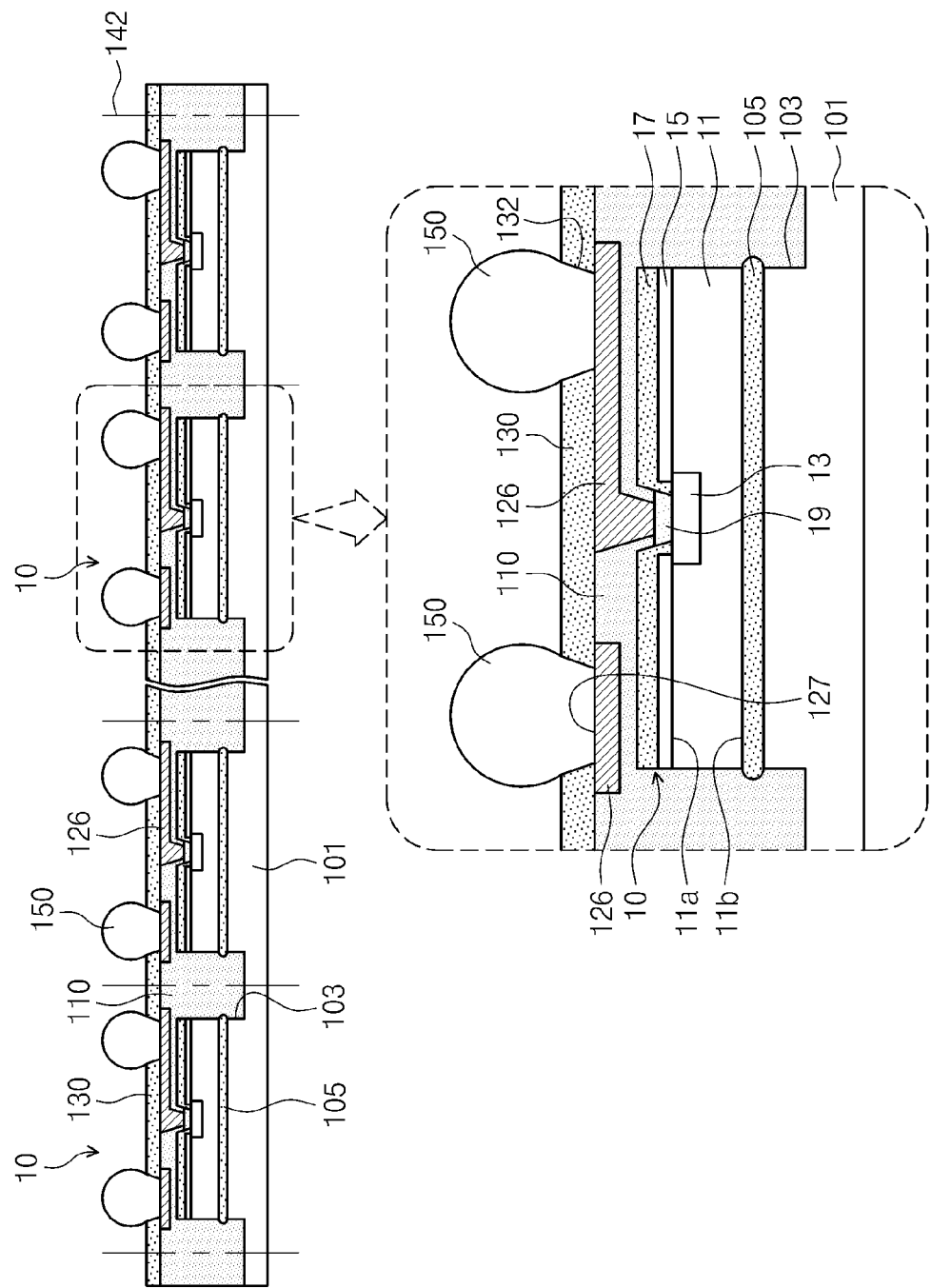

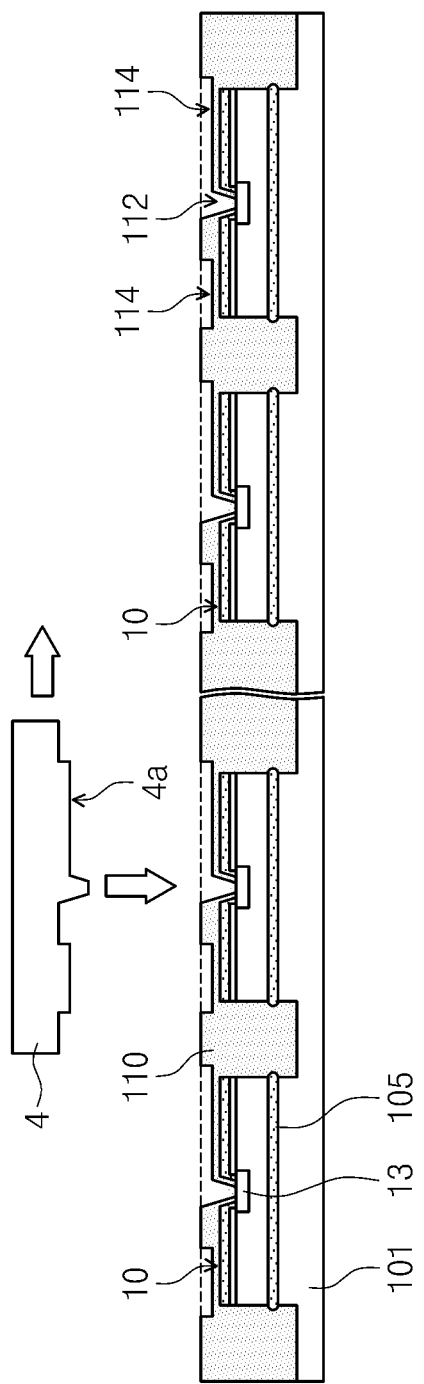

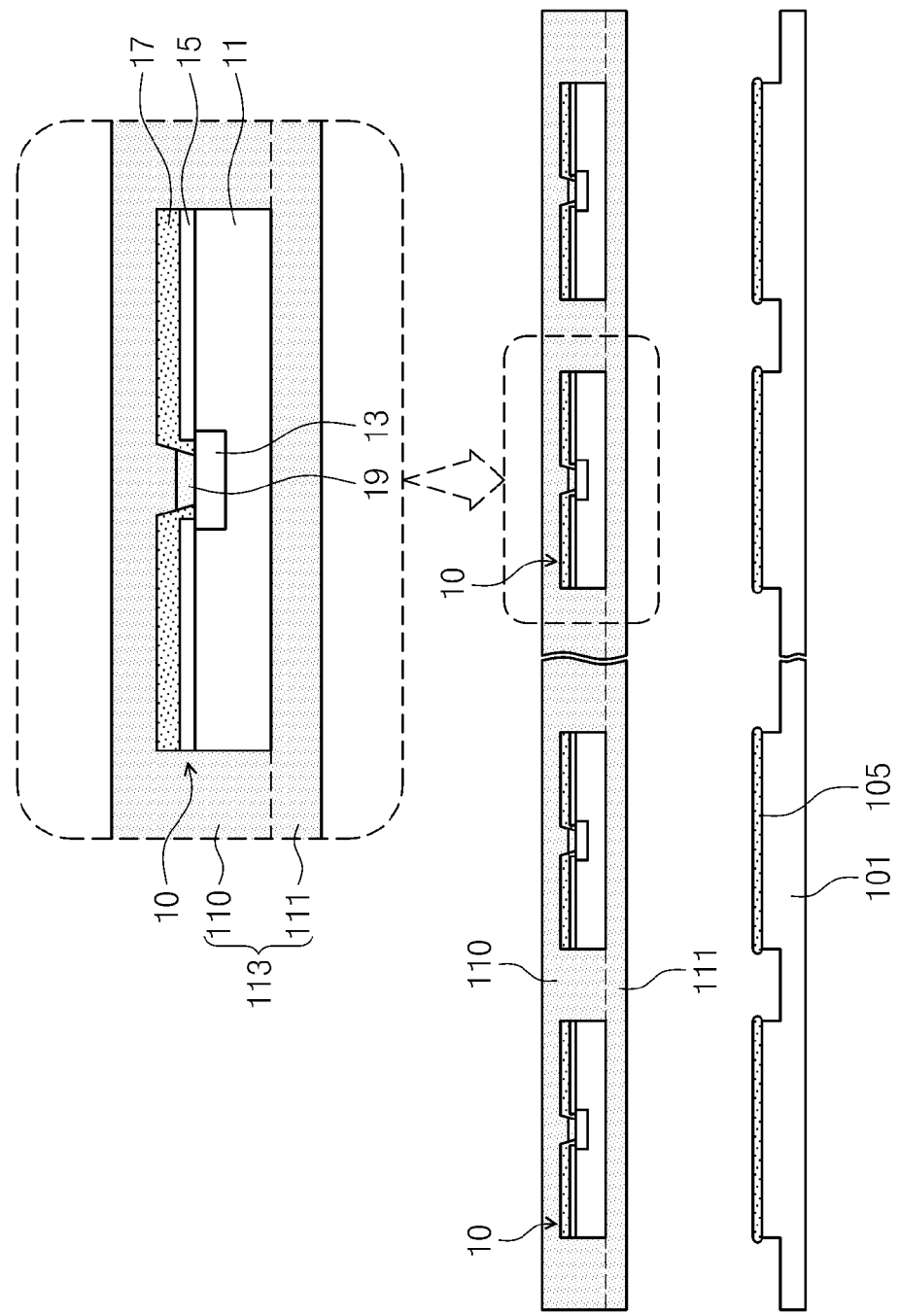

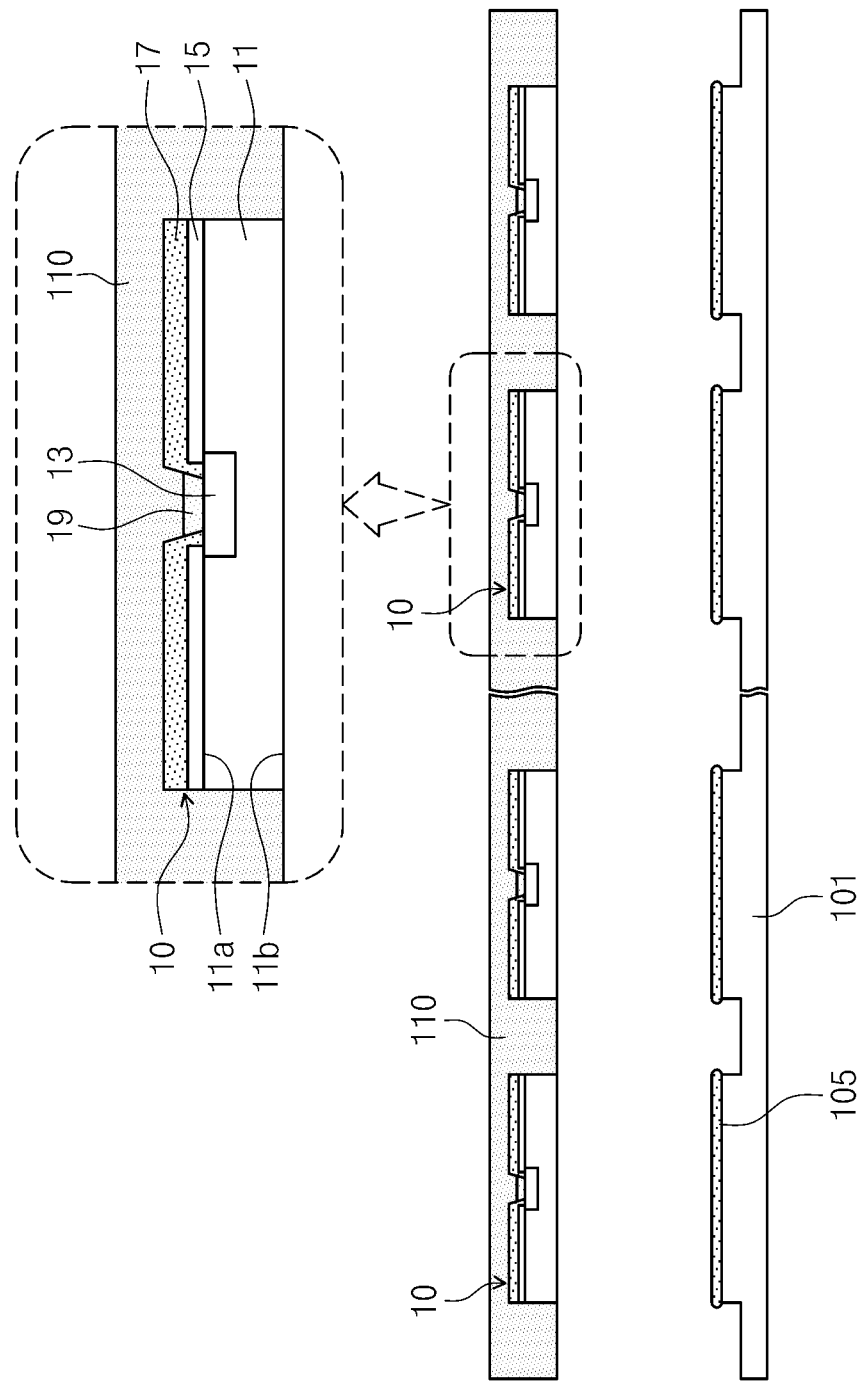

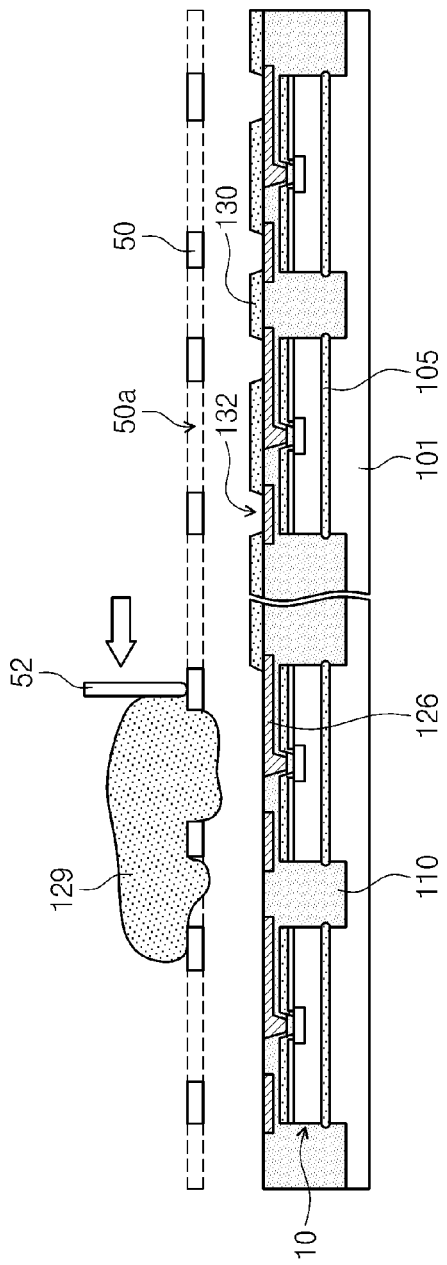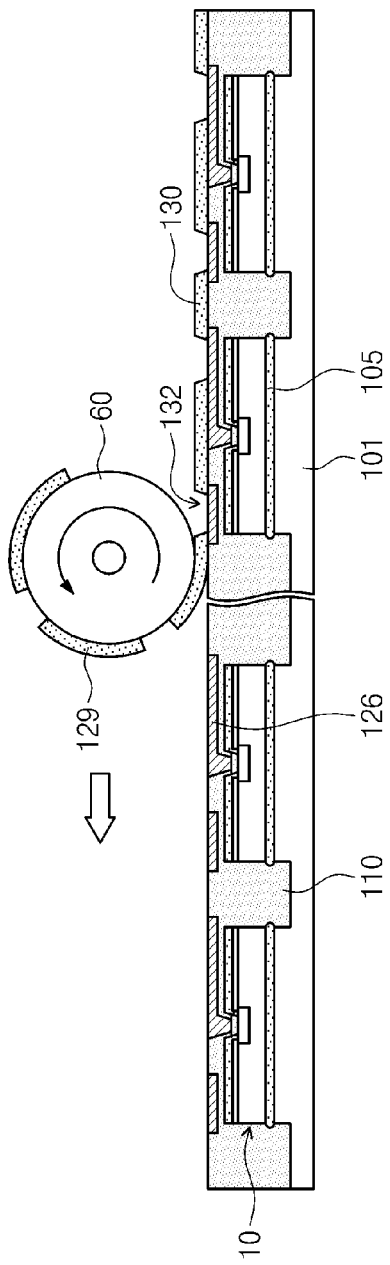

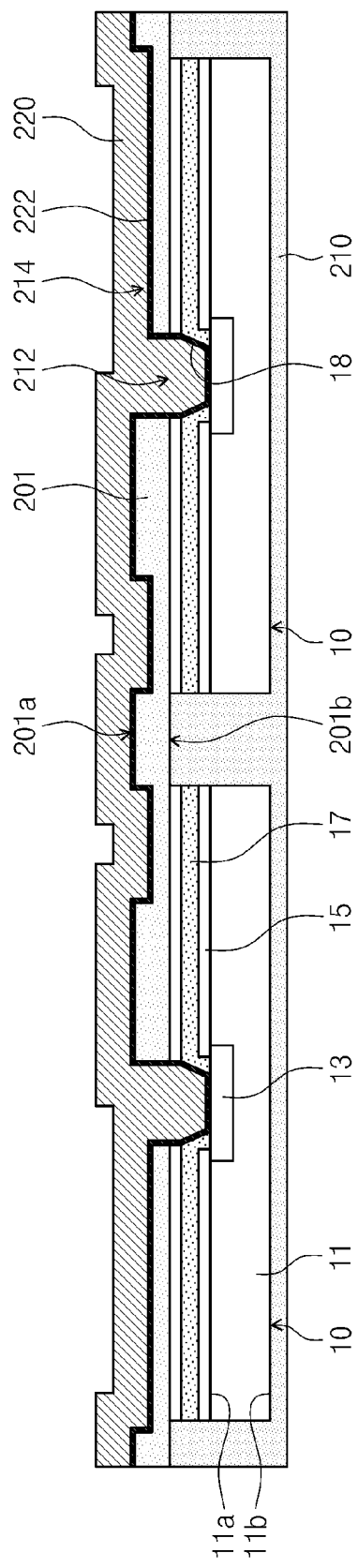

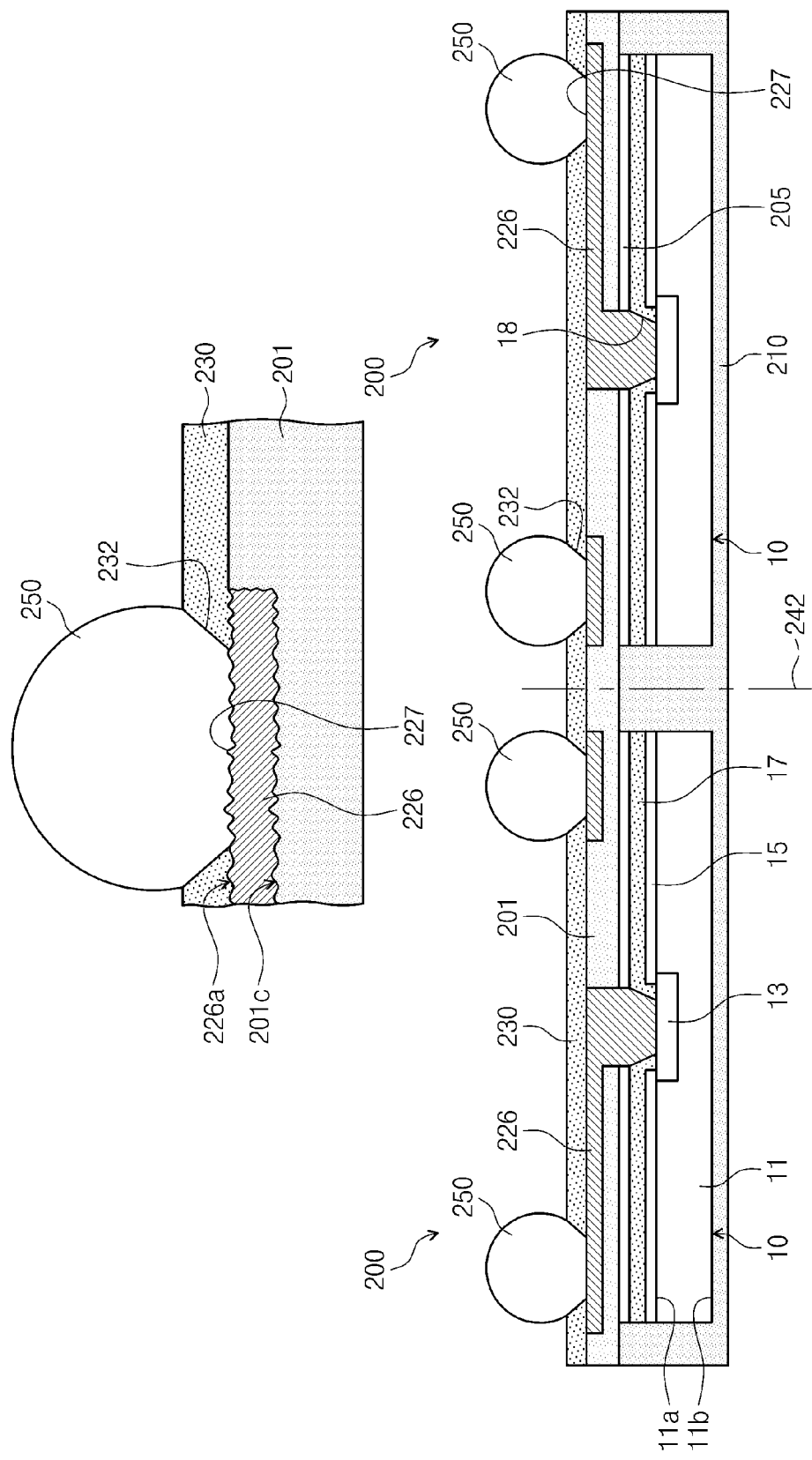

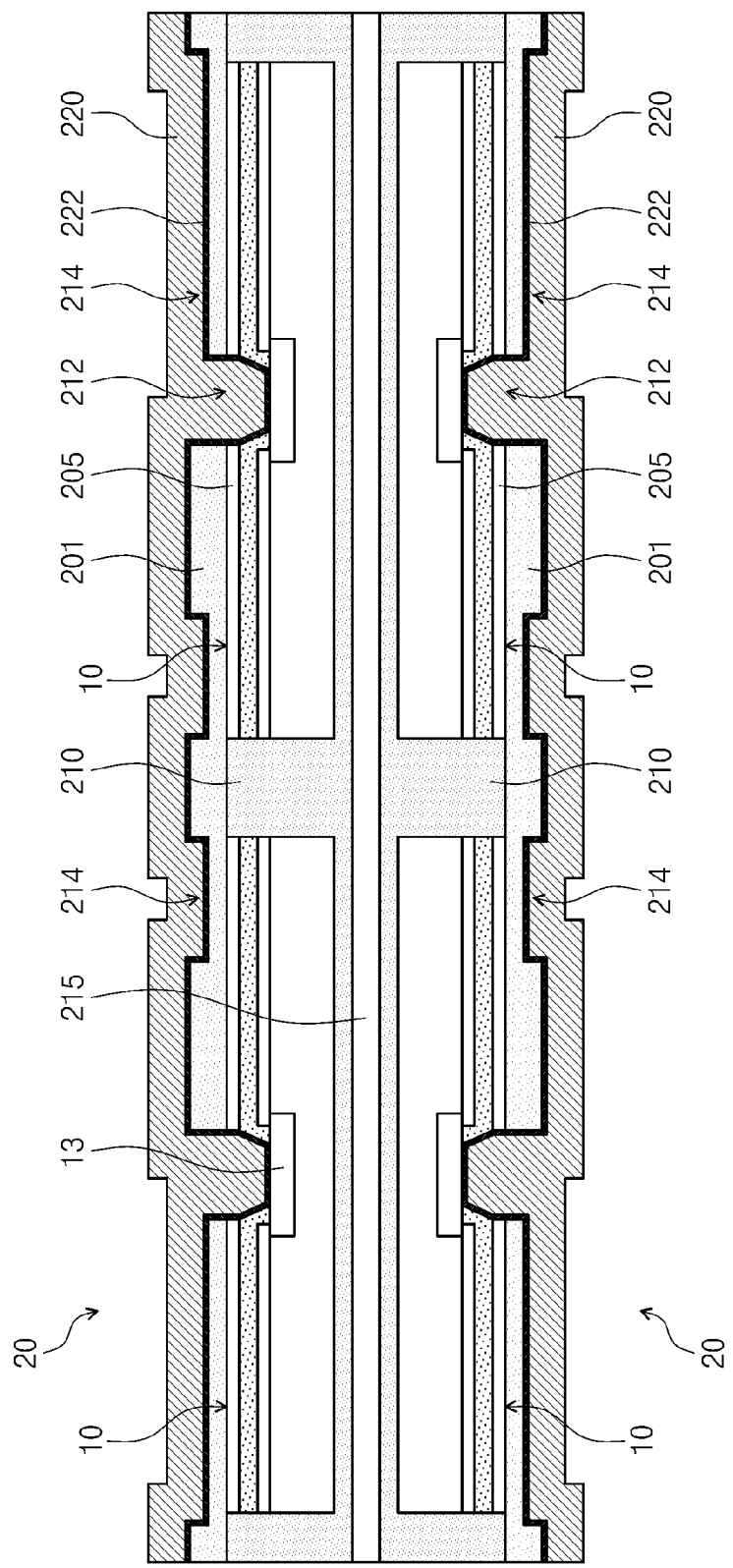

SEMICONDUCTOR PACKAGES

CROSS-REFERENCE TO RELATED APPLICATION

This U.S. non-provisional patent application claims priority under 35 U.S.C. §119 to Korean Patent Application No. 10-2010-0107831, filed on Nov. 1, 2010, the entire contents of which are hereby incorporated by reference.

BACKGROUND

The present disclosure herein relates to a semiconductor, and more particularly, to a semiconductor package and a method of fabricating the same.

As electronic devices become miniaturized, a size of a semiconductor package also becomes smaller, thinner, and lighter. Typically, in a semiconductor package, semiconductor chips are mounted on a printed circuit board (PCB) and the semiconductor chips are electrically connected to each other using bonding wires or bumps. In fabricating a semiconductor package, a photo process using relatively costly photo equipment has been performed. Accordingly, a method of fabricating a semiconductor package with a simple structure without using relatively expensive equipment is needed.

SUMMARY

Embodiments of the present disclosure provide a semiconductor package having a structure for reducing manufacturing costs and a method of fabricating the same.

Embodiments of the inventive concept provide semiconductor packages including a semiconductor chip having a bonding pad, a metal line connected electrically to the bonding pad and having a contact portion electrically contacting an external terminal, an insulation layer covering the metal line and having an opening that defines the contact portion, and a molding layer on the semiconductor chip, wherein the molding layer includes a recess pattern exposing the bonding pad and extending from the bonding pad to the contact portion, and the metal line is disposed in the recess pattern to contact the bonding pad.

In some embodiments, the recess pattern may include a vertical via hole exposing the bonding pad, and a horizontal groove extending from the via hole to be recessed along a surface of the molding layer.

In some embodiments, the metal line may include a vertical pattern filling the via hole and directly or indirectly contacting the bonding pad, and a horizontal pattern extending from the vertical pattern by filling the groove and contacting the external terminal through the contact portion.

In some embodiments, the semiconductor chip may further include a metal layer between the vertical pattern and the bonding pad.

In some embodiments, the molding layer may include a transparent layer of silicon hybrid material or an opaque layer of epoxy material.

In some embodiments, the molding layer may include a molding substrate covering a top surface of the semiconductor chip, and a bottom molding layer covering a bottom surface and sides of the semiconductor chip, wherein the molding substrate includes the recess pattern.

In some embodiments, the semiconductor packages may further include a sustain board supporting the semiconductor chip.

In some embodiments, the metal line may have a relatively rougher surface texture than that of the molding layer.

In some embodiments, a boundary surface between the contact portion and the external terminal may be uneven.

In some embodiments of the inventive concept, methods of fabricating a semiconductor package include providing a semiconductor chip with a bonding pad, forming a molding layer on the semiconductor chip, forming a metal line in the molding layer and electrically connected to the bonding pad, and forming an insulation layer that covers the metal line and has an opening defining a contact portion contacting an external terminal.

In some embodiments, the forming of the metal line may include patterning the molding layer to form a recess pattern that exposes the bonding pad and extends along a surface of the molding layer, and forming the metal line that contacts the bonding pad by filling the recess pattern with metal.

In some embodiments, the forming of the recess pattern may include forming a vertical via hole that exposes the bonding pad by drilling the molding layer using a laser, and forming a horizontal groove that is connected to the via hole and horizontally extends along the surface of the molding layer.

In some embodiments, the providing of the semiconductor chip may include forming a laser stop layer that protects the bonding pad from the laser by covering the bonding pad. The laser stop layer is formed using one of deposition, electroplating, or electroless plating of metal.

In some embodiments, the forming of the recess pattern may include providing a dent device on the semiconductor chip, the dent device having an embossed surface corresponding to the recess pattern, and forming the recess pattern corresponding to the embossed surface on the surface of the molding layer by pressing the dent device toward the semiconductor chip into the molding layer, wherein the recess pattern includes a vertical via hole exposing the bonding pad and a horizontal groove connected to the vertical via hole and extending horizontally along the surface of the molding layer, and the vertical via hole and the horizontal groove are simultaneously formed by the dent device.

In some embodiments, the methods further include, after forming of the recess pattern, removing a residue remaining in the vertical via hole.

In some embodiments, the forming of the metal line may include forming a seed layer on the molding layer including in the recess pattern through electroless plating, forming a conductive layer on the seed layer through electroplating, and forming the metal line defined in the recess pattern by polishing the conductive layer and the seed layer.

In some embodiments, the forming of the metal line may include at least one of forming an inner surface of the molding layer that constitutes a bottom surface of the recess pattern to have a rougher texture than an outer surface of the molding layer, forming the electroless-plated seed layer on the inner surface of the molding layer to have a rough surface texture, and polishing a surface of the metal line have a rougher surface texture than the outer surface of the molding layer.

In some embodiments, the forming of the insulation layer may include providing a mesh mask on the semiconductor chip, the mesh mask including an opening, and providing the solder resist through the opening of the mesh mask onto the metal line of the semiconductor chip except at the contact portion.

In some embodiments, the forming of the insulation layer may include providing a roller on the semiconductor chip, the roller having an the solder resist attached thereto, and providing the solder resist onto the metal line of the semiconductor chip except at the contact portion by rotating the roller.

In some embodiments, the forming of the molding layer may include providing a molding substrate with a top surface and a bottom surface, forming a recess pattern that includes a via hole penetrating the mold substrate by patterning the top surface of the molding substrate, and that includes a horizontal groove connected to the vertical via hole and extending along the top surface of the molding substrate, exposing the bonding pad through the via hole by attaching a top surface of the semiconductor chip on a bottom surface of the molding substrate and facing a bottom surface of the molding substrate, and forming a bottom molding layer that covers a bottom surface and sides of the semiconductor chip on the bottom surface of the molding substrate, wherein the semiconductor chip is surrounded by the molding substrate and the molding layer including the bottom molding layer.

In some embodiments, the forming of the metal line may include forming molding layers on a plurality of semiconductor chips, bonding the bottom layers of molding layers of at least two respective semiconductor chips together to orient the recess patterns on two opposite outside facing sides, sequentially forming the seed layer and the conductive layer at each of the two opposite outside facing sides through a plating process, and forming the metal line at each of the two opposite outside facing sides by polishing the seed layer and the conductive layer.

In some embodiments, the polishing of the seed layer and the conductive layer may be performed after separating the two sets of the molding layers from each other.

A semiconductor package, in accordance with an embodiment of the present invention, comprises a semiconductor chip including a plurality of bonding pads arranged in a column at or about a center portion of the semiconductor chip, and a plurality of external terminals located at edge portions of the semiconductor chip, a plurality of metal lines, each metal line being respectively electrically connected between a bonding pad of the plurality of bonding pads and an external terminal of the plurality of external terminals, wherein a first group of the metal lines includes metal lines having at least one bent portion in a plan view, and a second group of the metal lines includes metal lines having a straight line configuration in a plan view, an insulation layer covering the metal lines and having a plurality of openings exposing respective contact portions on the metal lines contacting the external terminals, and a molding layer on the semiconductor chip, wherein the molding layer comprises a plurality of recess patterns exposing the bonding pads and extending from the bonding pads to the contact portions, and wherein the metal lines are disposed in the recess patterns.

In some embodiments, a recess pattern comprises a hole exposing the bonding pad and extending in a first direction into the molding layer, and a groove extending from an upper portion of the hole in a second direction perpendicular to the first direction along a surface of the molding layer.

In some embodiments, a metal line comprises a first pattern filling the hole and electrically contacting the bonding pad, and a second pattern filling the groove and extending from the first pattern, wherein the second pattern electrically contacts an external terminal at a contact portion.

BRIEF DESCRIPTION OF THE DRAWINGS

The accompanying drawings are included to provide a further understanding of the embodiments of the inventive concept, and are incorporated in and constitute a part of this specification. The drawings illustrate exemplary embodiments of the inventive concept. In the drawings:

FIGS. 2A through 2H are sectional views illustrating a method of fabricating a semiconductor package according to an embodiment of the inventive concept;

FIGS. 5A through 5C are sectional views illustrating groove formation in a method of fabricating a semiconductor package according to an embodiment of the inventive concept;

FIGS. 6A and 6B are sectional views illustrating a method of fabricating a semiconductor package according to an embodiment of the inventive concept;

FIGS. 7A and 7B are sectional views illustrating molding layer formation in a method of fabricating a semiconductor package according to an embodiment of the inventive concept;

FIGS. 8A and 8B are sectional views illustrating a formation method of a solder mask layer in a method of fabricating a semiconductor package according to an embodiment of the inventive concept;

FIGS. 9A through 9F are sectional views illustrating a method of fabricating a semiconductor package according to an embodiment of the inventive concept;

FIGS. 11A and 11B are sectional views illustrating a method of fabricating a semiconductor package according to an embodiment of the inventive concept;

DETAILED DESCRIPTION OF THE EMBODIMENTS

Figure 1A:
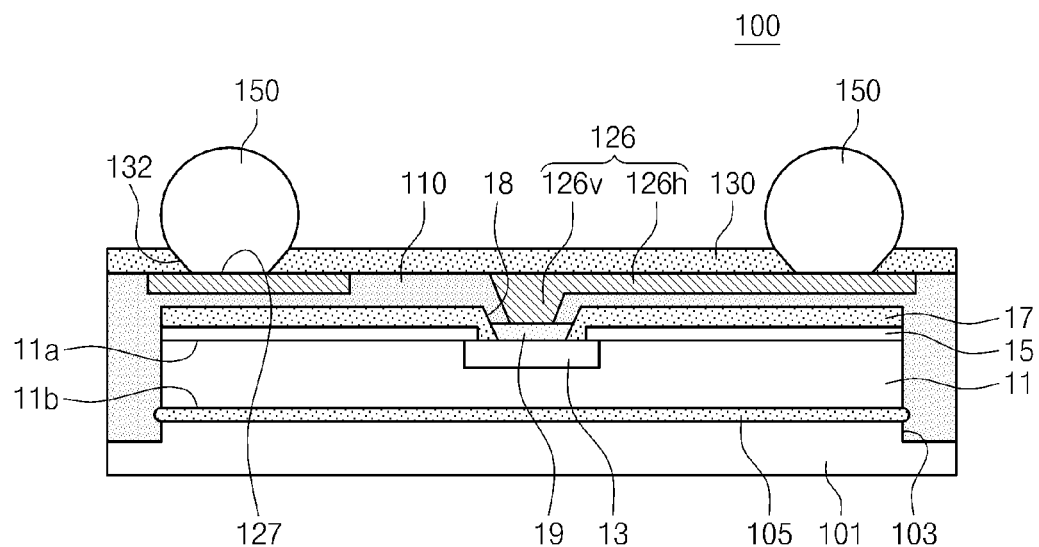
FIG. 1A is a sectional view of a semiconductor package taken along the line A-A' of FIG. 1B, in accordance with an embodiment of the inventive concept.

Hereinafter, exemplary embodiments of the inventive concept are described in detail with reference to the accompanying drawings.

Exemplary embodiments of the inventive concept are described below in more detail with reference to the accompanying drawings. The inventive concept may, however, be embodied in different forms and should not be construed as limited to the embodiments set forth herein. Like reference numerals may refer to like elements throughout.

Figure 1B:
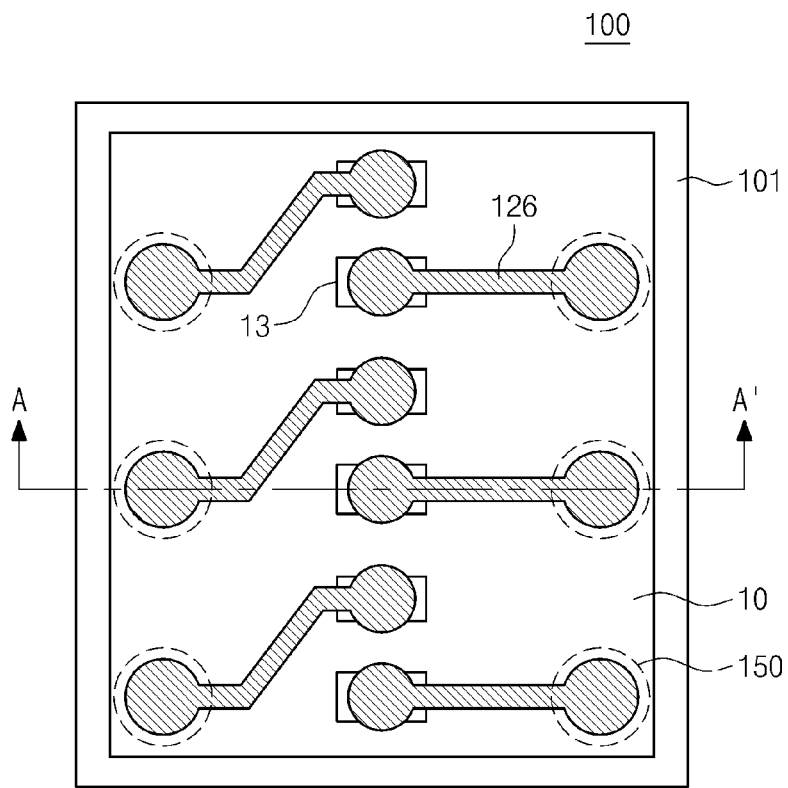
FIG. 1B is a plan view of a semiconductor package, in accordance with an embodiment of the inventive concept.

FIGS. 1A and 1B are views illustrating a semiconductor package according to an embodiment of the inventive concept. FIG. 1A is a sectional view taken along the line A-A' of FIG. 1B. FIG. 1B is a plan view of the semiconductor package of FIG. 1A.

Referring to FIGS. 1A and 1B, a semiconductor package 100 includes a semiconductor chip 10 molded by a molding layer 110. The semiconductor chip 10 is attached to a sustain board 101. The sustain board 101 is formed of an insulation material such as, for example, a material identical or similar to the molding layer 110 or an insulation material such as glass different from the molding layer 110. As another example, in accordance with an embodiment of the inventive concept, the sustain board 101 is formed of metallic material such as stainless steel or iron. The sustain board 101 has a flat or stepped top surface on which the semiconductor chip 10 is disposed. For example, the sustain board 101 further includes a protruding attachment part 103 that defines an area where the semiconductor chip 10 is attached. The semiconductor chip 10 is placed on the attachment part 103, with an adhesive layer 105 interposed between the semiconductor chip 10 and the attachment part 103.

The semiconductor chip 10 may be a memory chip, non-memory chip or a combination thereof. The semiconductor chip 10 comprises a semiconductor substrate 11 including a top surface 11a having a bonding pad 13 and a bottom surface 11b located opposite to the top surface 11a, a passivation layer 15 covering the top surface 11a and including an open portion exposing the bonding pad 13, and an insulation layer 17 covering the passivation layer 15. In accordance with an embodiment of the inventive concept, the top surface 11a of the semiconductor substrate 11 is an active surface where a circuit pattern (not shown) electrically connected to the bonding pad 13 is formed and the bottom surface 11b of the semiconductor substrate 11 is an inactive surface. The semiconductor chip 10 has a center pad structure where a plurality of bonding pads 13 are arranged in at least one column at the center of the semiconductor chip 10. As shown in the cross-sectional view of FIG. 1A, the insulation layer 17 includes an opening 18 that exposes the bonding pad 13. The semiconductor chip 10 includes a layer 19 that covers all or a portion of the bonding pad 13. This layer 19 is a laser stop layer that protects the bonding pad 13 and/or the semiconductor chip 10 from being damaged by a laser, as described below.

The semiconductor package 100, according to an embodiment, does not require a printed circuit board (PCB) that is electrically connected to the semiconductor chip 10 to provide an electrical connection with an external device, and accordingly, a bonding layer or a bump, which electrically connects the semiconductor chip 10 with the PCB, is also not required. According to this embodiment, the molding layer 110 comprises an external terminal 150 that electrically connects the semiconductor package 100 to an external device and a metal line 126 that electrically connects the external terminal 150 to the semiconductor chip 10. For example, a routing pattern 126, which is a metal line electrically connected to the bonding pad 13, is embedded in the molding layer 110. One end of the routing pattern 126 penetrates the molding layer 110 to directly contact the bonding pad 13 or indirectly contact the bonding pad 13 through the laser stop layer 19, and the other end of the routing pattern 126 extends to the edge in a linear or bending form to contact the external terminal 150, for example, a solder ball. The routing pattern 126 divided into a vertical pattern 126v in the form of a stud bump and a horizontal pattern 126h in the form of a horizontal line extending from the vertical pattern 126v, which contacts the bonding pad 13 or the laser stop layer 19. In accordance with an embodiment of the inventive concept, the semiconductor package 100 does not require a redistribution line because the routing pattern 126 serves as the redistribution line.

A solder mask layer 130 is formed on the molding layer 110 to cover the routing pattern 126. The solder mask layer 130 includes an opening to expose a ball land 127 to which the solder ball 150 is attached. A portion of the horizontal pattern 126h of the routing pattern 126 is defined as the ball land 127. In this embodiment, although a solder ball 150 is exemplarily used as the external terminal, this does not exclude using another electrical connection medium such as a bonding wire, as the external terminal. In accordance with an embodiment of the inventive concept, the semiconductor package 100 has a fan-in structure where the solder ball 150 is disposed within a region of the semiconductor chip 10.

In the semiconductor package 100, the ball land 127 has a different surface roughness from the molding layer 110. For example, a surface of the ball land 127 is rougher than the molding layer 110. The rough surface of the ball land 127 provides improved solder joint reliability with the solder ball 150. This is described further below with reference to FIGS. 4A to 4C.

Figure 1C:
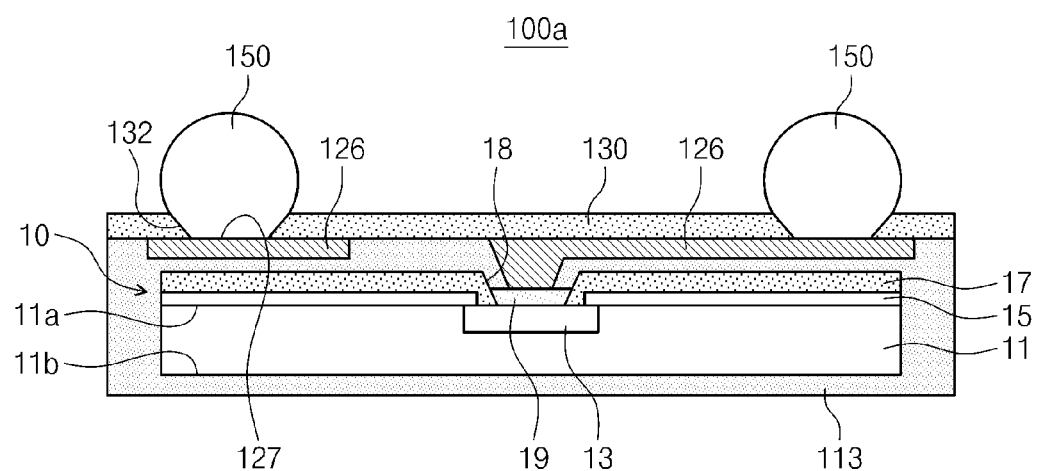
FIG. 1C is a sectional view illustrating a semiconductor package according to an embodiment of the inventive concept.

FIG. 1C is a sectional view illustrating a semiconductor package according to an embodiment of the inventive concept.

Referring to FIG. 1C, identical or similar to FIG. 1A, a semiconductor package 100a includes a molding layer 113 in which a routing pattern 126 is embedded and a solder ball 150 on the molding layer 113 as an external terminal that contacts the routing pattern 126. The semiconductor package 100a does not include a sustain board 101 unlike FIG. 1A. According to this embodiment, if the sustain board 101 is not provided, a bottom surface 11b of a semiconductor substrate 11 is exposed. Thus, in order to protect the semiconductor package 100a, the molding layer 113 is enlarged to cover the bottom surface 11b of the semiconductor substrate 11.

Figure 1D:
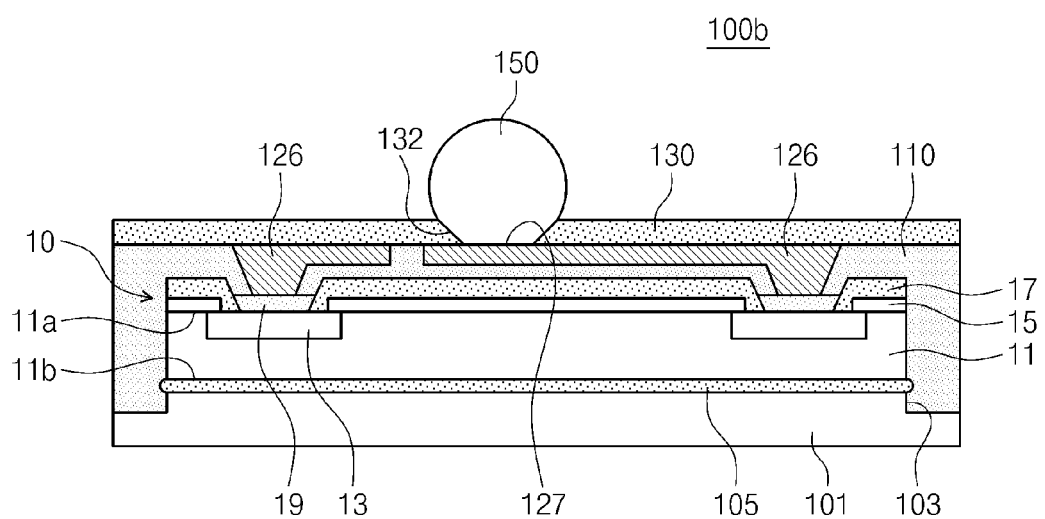
FIG. 1D is a sectional view of a semiconductor package taken along the line B-B' of FIG. 1E, in accordance with an embodiment of the inventive concept.
Figure 1E:
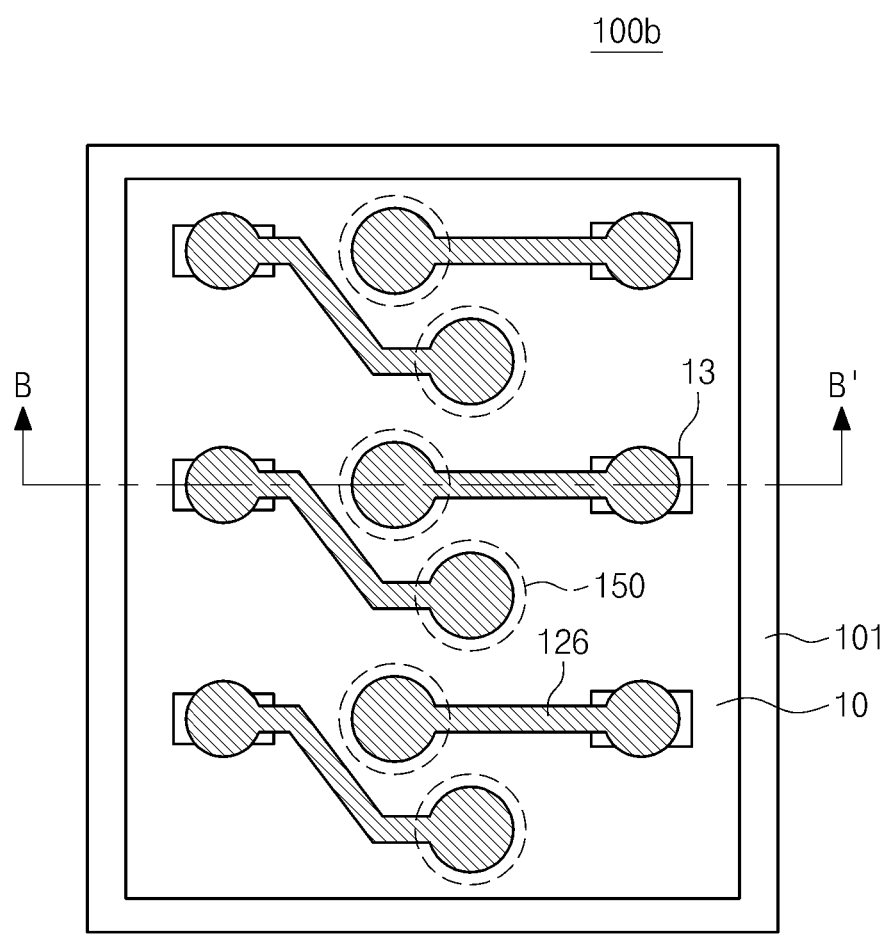
FIG. 1E is a plan view of a semiconductor package, in accordance with an embodiment of the inventive concept.

FIGS. 1D and 1E are views illustrating a semiconductor package according to an embodiment of the inventive concept. FIG. 1D is a sectional view taken along the line B-B' of FIG. 1E. FIG. 1E is a plan view of the semiconductor package of FIG. 1D.

Referring to FIGS. 1D and 1E, identical or similar to FIG. 1A, a semiconductor package 100b includes a semiconductor chip 10 disposed on a sustain board 101 and molded by a molding layer 110, a routing pattern 126 embedded in the molding layer 110, and a solder ball 150 as an external terminal disposed on the molding layer 110 and electrically connected to the routing pattern 126. Unlike FIG. 1A, the semiconductor chip 10 has an edge pad structure. For example, a plurality of bonding pads 13 are arranged at the edge of the semiconductor chip 10. According to this embodiment, the solder ball 150 is arranged in at least one column or in a zigzag at the center of the semiconductor chip 10. In accordance with an embodiment of the inventive concept, the semiconductor package 100b may omit a sustain board 101 identical or similar to FIG. 1C. In this case, the molding layer 110 may be enlarged to cover a bottom surface 11b of a semiconductor substrate 11.

Figure 1F:
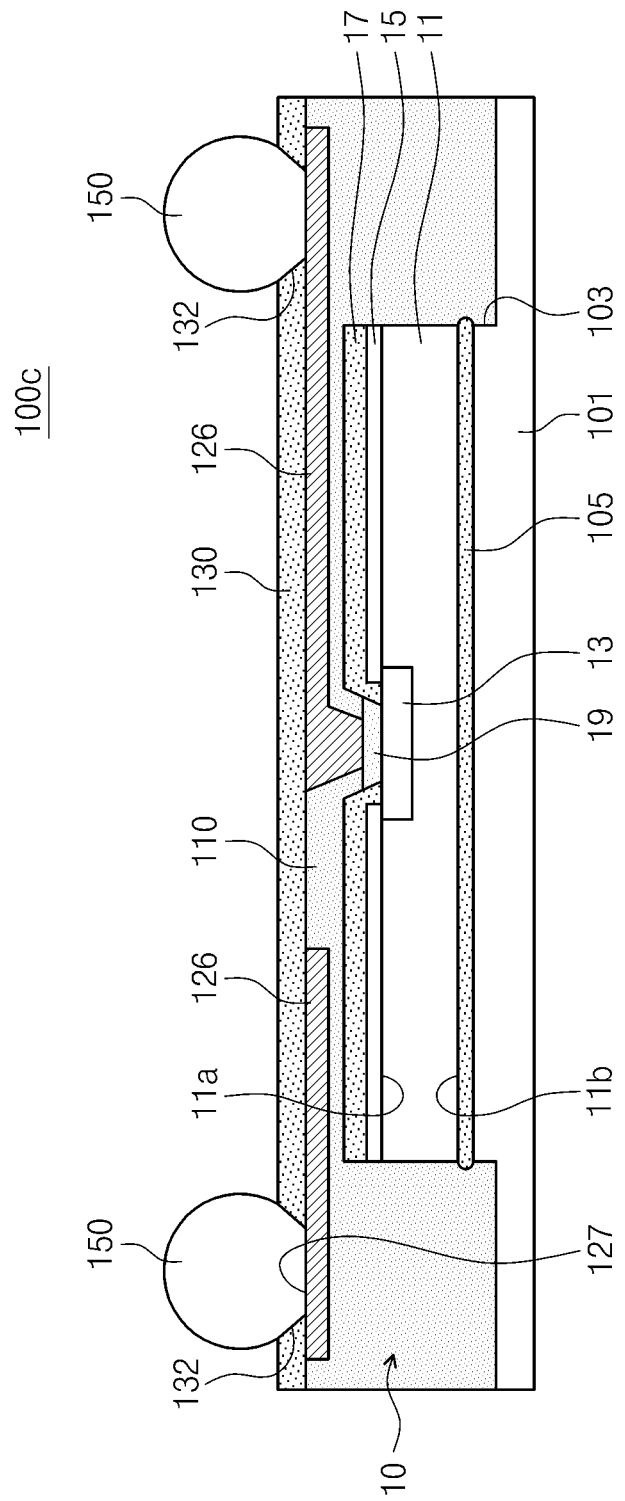
FIG. 1F is a sectional view of a semiconductor package taken along the line C-C' of FIG. 1G, in accordance with an embodiment of the inventive concept.
Figure 1G:
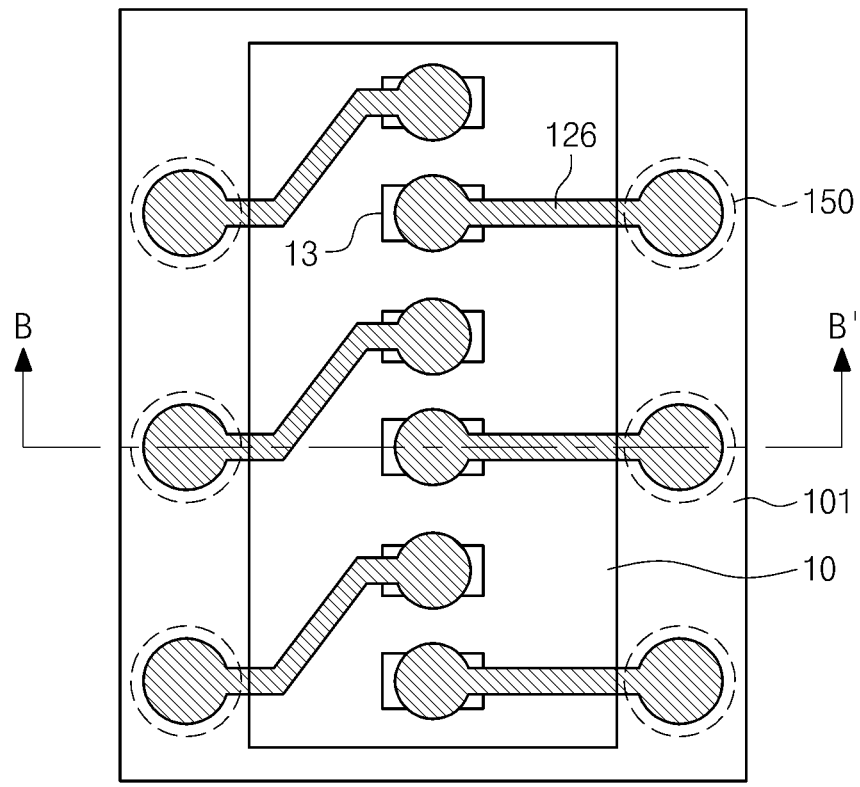
FIG. 1G is a plan view of a semiconductor package, in accordance with an embodiment of the inventive concept.

FIGS. 1F and 1G are views illustrating a semiconductor package according to an embodiment of the inventive concept. FIG. 1F is a sectional view taken along the line B-B' of FIG. 1G. FIG. 1G is a plan view of the semiconductor package of FIG. 1F.

Referring to FIGS. 1F and 1G, a semiconductor package 100c has a fan-out structure unlike FIG. 1A. For example, a routing pattern 126 extends beyond the edge of the semiconductor chip 10 and a ball land 127 is defined in a region outside of the semiconductor chip 10 to contact a solder ball 150. In an alternative embodiment, the semiconductor package 100c does not include a sustain board 101 identical to or similar to FIG. 1C, and a molding layer 110 extends to cover a bottom surface 11b of a semiconductor substrate 11. In another example embodiment, the semiconductor chip 10 has an edge pad structure, such that a plurality of the solder balls 150 are arranged at the center of the semiconductor package 100c.

Figure 1H:
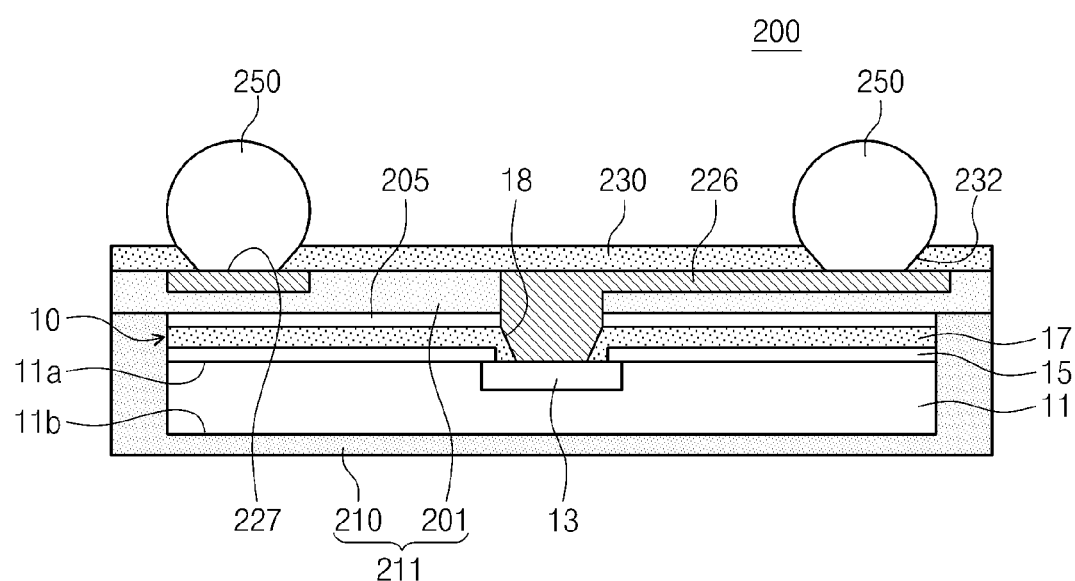
FIG. 1H is a sectional view illustrating a semiconductor package according to an embodiment of the inventive concept.

FIG. 1H is a sectional view illustrating a semiconductor package according to an embodiment of the inventive concept.

Referring to FIG. 1H, a semiconductor package 200 includes a semiconductor chip 10, a resin layer 210 covering bottom and side surfaces of the semiconductor chip 10, a molding substrate 201 attached to a top surface of the semiconductor chip 10, and a solder ball 250 as an external terminal electrically connected to the semiconductor chip 10. In the semiconductor chip 10, the bottom and side surfaces are molded by the resin layer 210 and the top surface is molded by the molding substrate 201. In this specification, the resin layer 210 and the molding substrate 201 are defined as a molding layer 211 surrounding the semiconductor chip 10. According to this embodiment, a routing pattern 226 electrically connecting the semiconductor chip 10 to the solder ball 250 is embedded in the molding substrate 201. The semiconductor package 200 has a planar structure identical or similar to that of FIG. 1B.

According to this embodiment, unlike FIG. 1A, there is no need to directly apply a laser to the semiconductor chip 10, so that the laser stop layer 19 protecting the bonding pad 13 and the semiconductor chip 10 from laser damage is omitted. This will be described in further detail with reference to FIGS. 9A and 9B.

FIGS. 2A through 2H are sectional views illustrating a method of fabricating a semiconductor package according to an embodiment of the inventive concept.

Figure 2A:
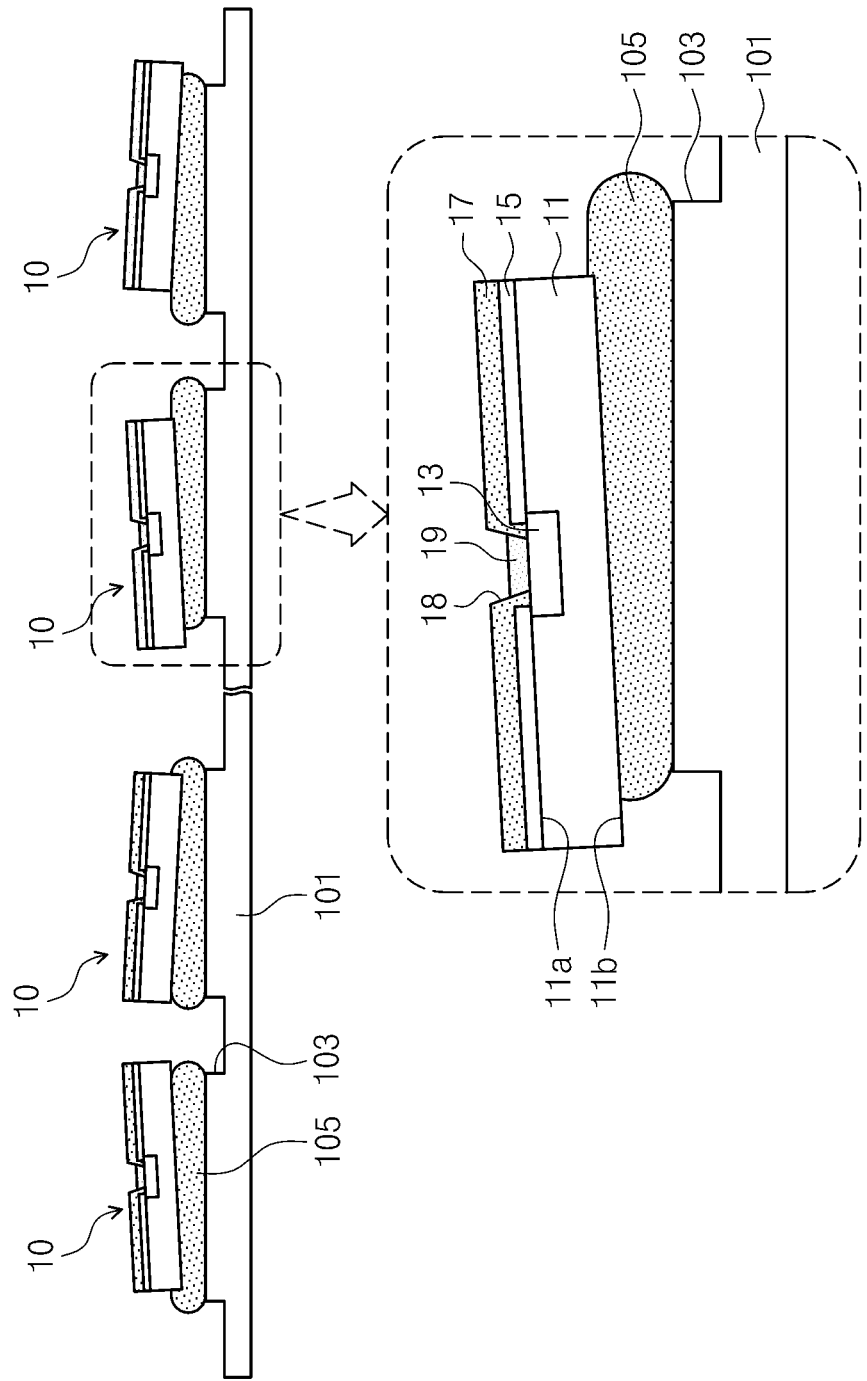
Figure 2C:
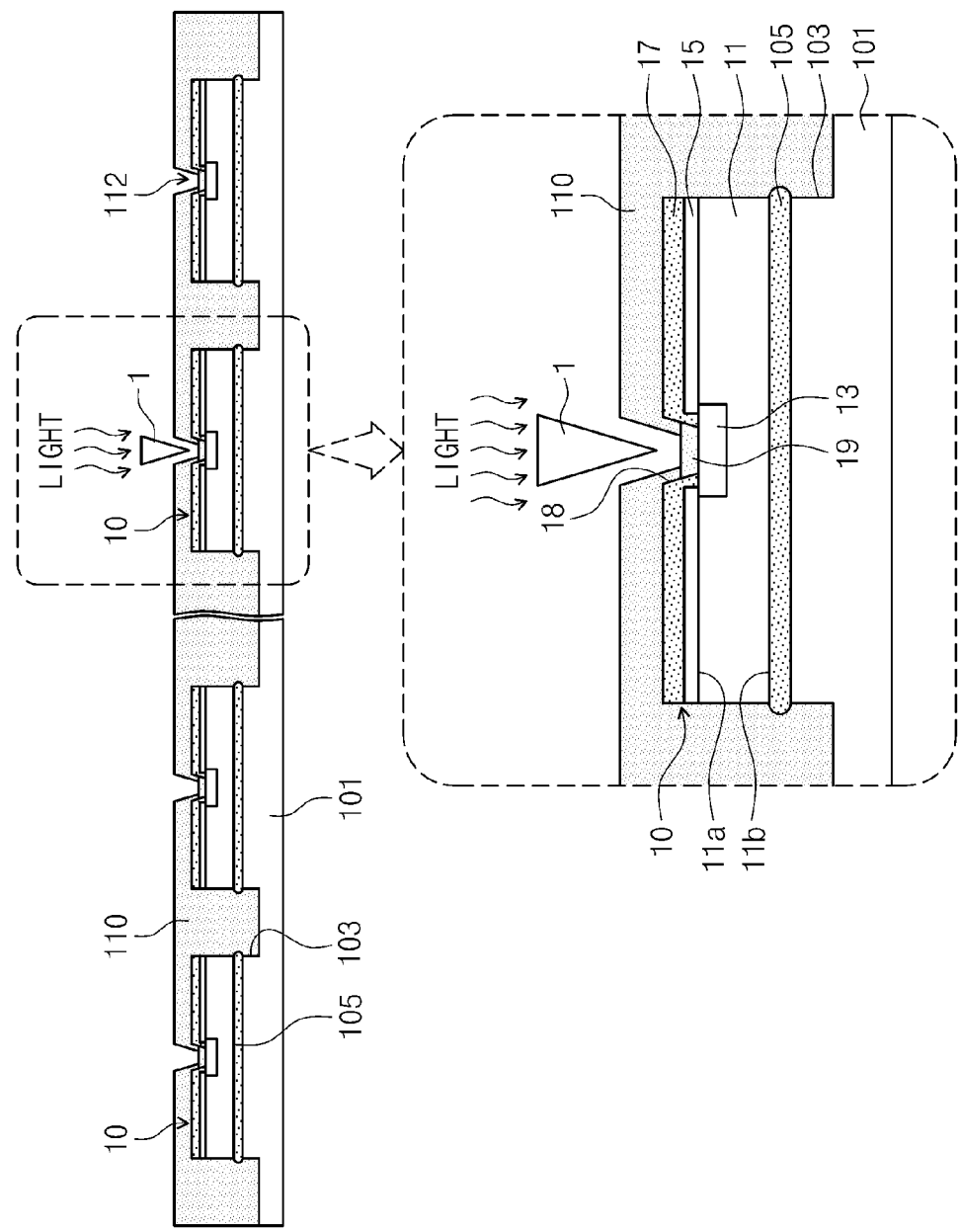
Figure 2F:
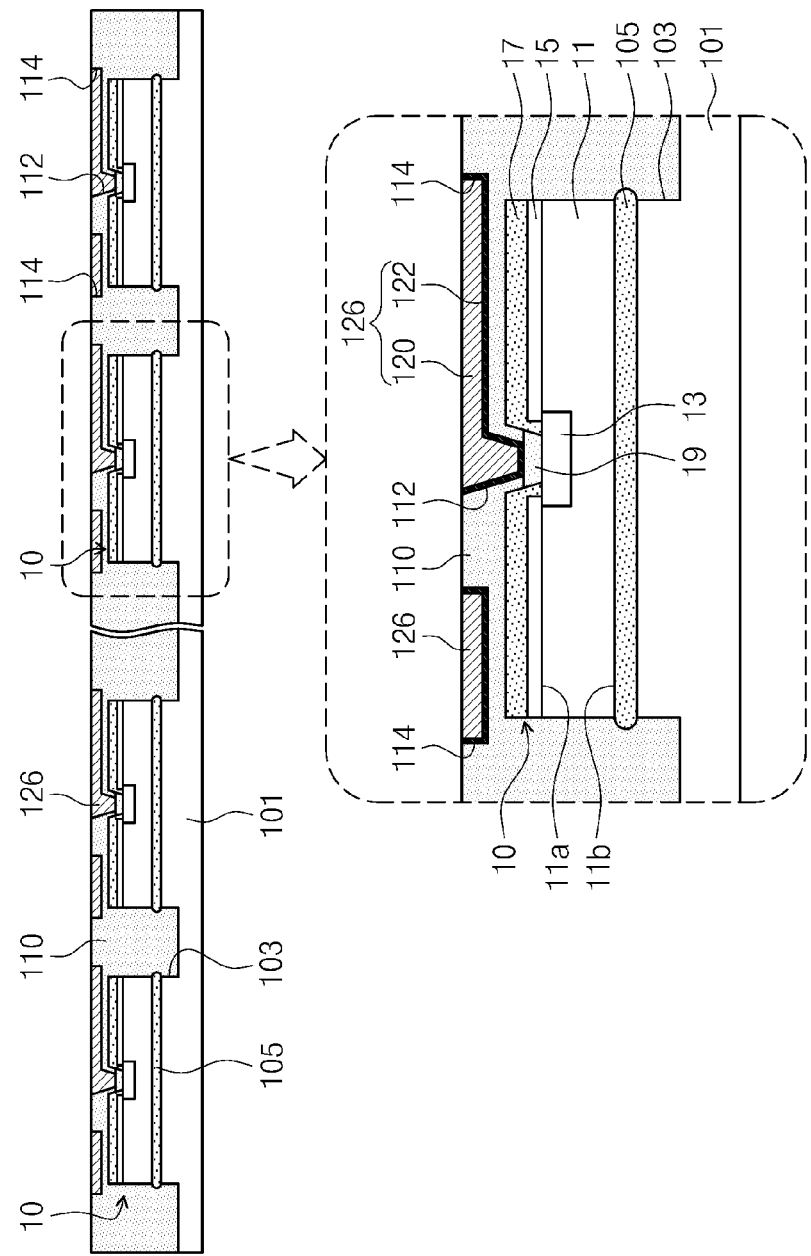
Figure 3A:
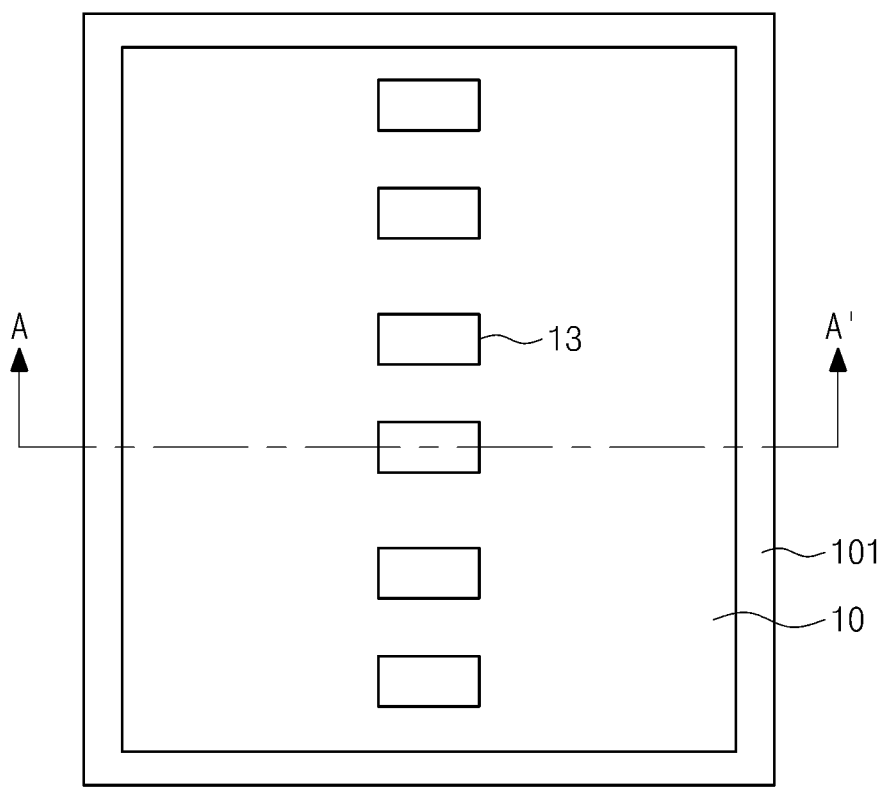
FIG. 3A is a plan view illustrating a portion of FIG. 2A.
Figure 3B:
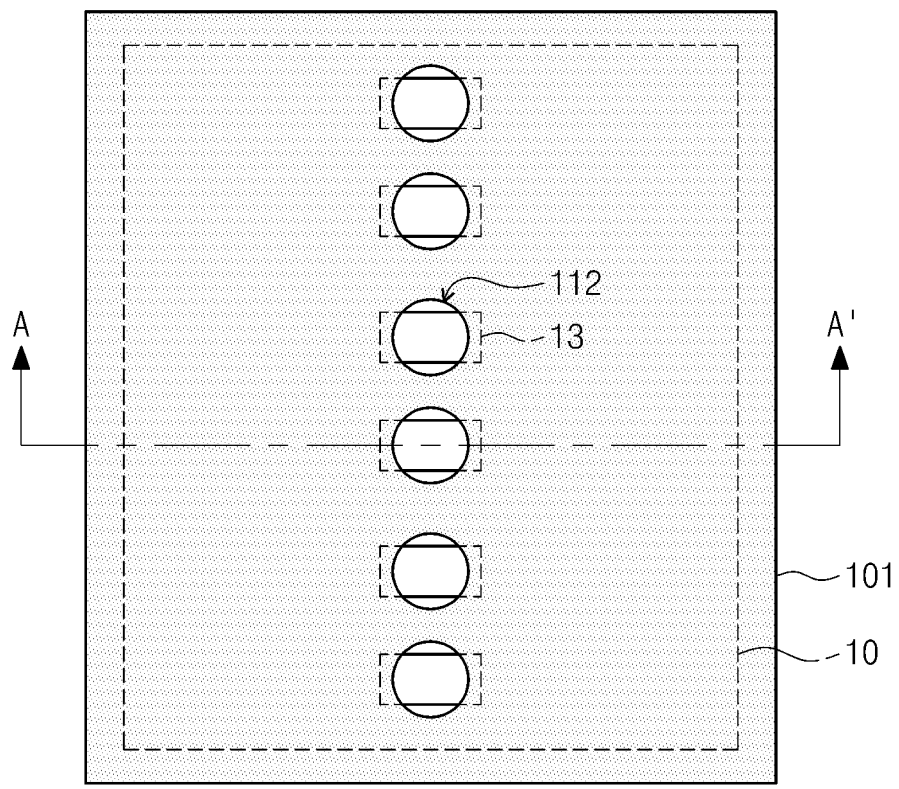
FIG. 3B is a plan view illustrating a portion of FIG. 2C.
Figure 3C:
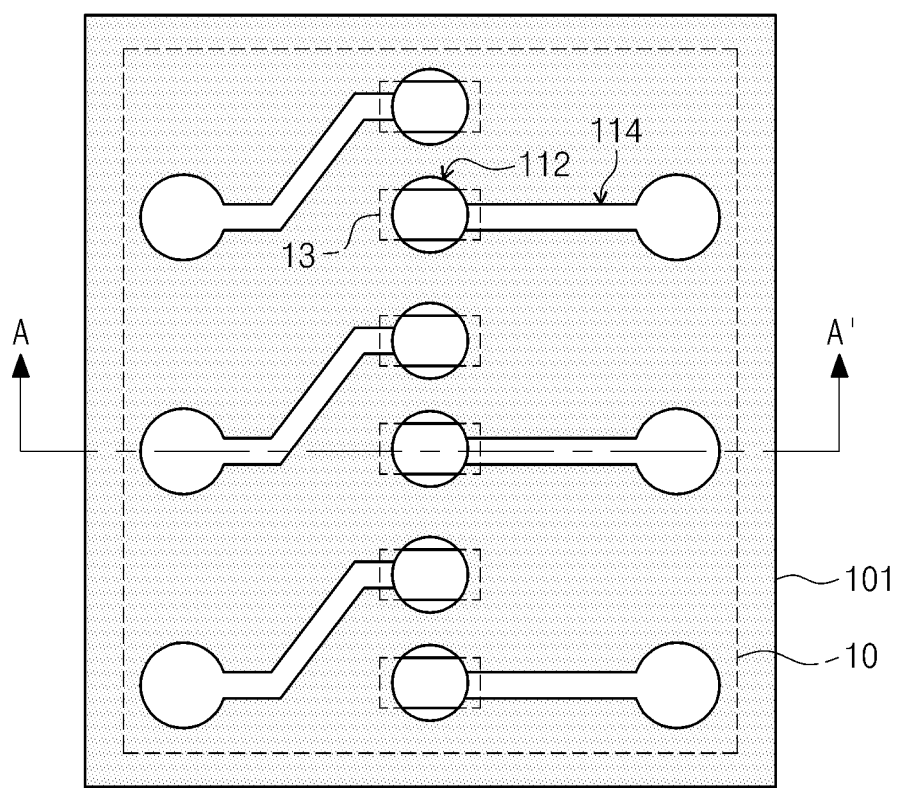
FIG. 3C is a plan view illustrating a portion of FIG. 2D.

FIGS. 3A through 3D are views illustrating a method of fabricating a semiconductor package according to an embodiment of the inventive concept. FIGS. 3A, 3B, and 3C are views illustrating respective portions of FIGS. 2A, 2C, and 2D. Portions of FIGS. 2A, 2C, 2D, and 2F are sectional views taken along the lines A-A' of FIGS. 3A, 3B, 3C, and 3D, respectively.

Figure 4A:
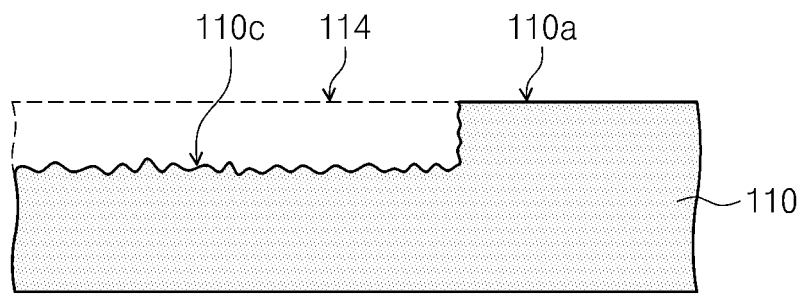
FIG. 4A is an enlarged sectional view of a portion of FIG. 2D.
Figure 4B:
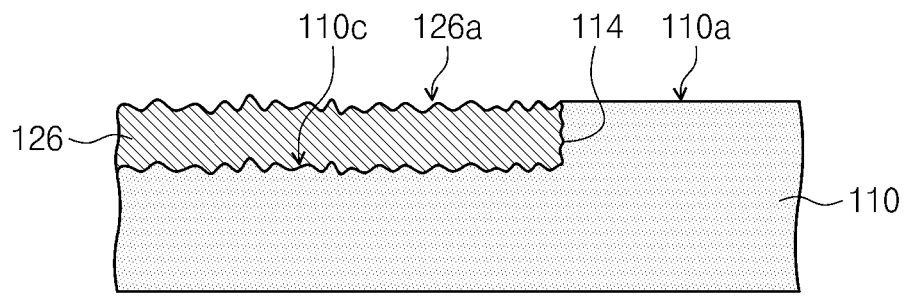
FIG. 4B is an enlarged sectional view of a portion of FIG. 2F.
Figure 4C:
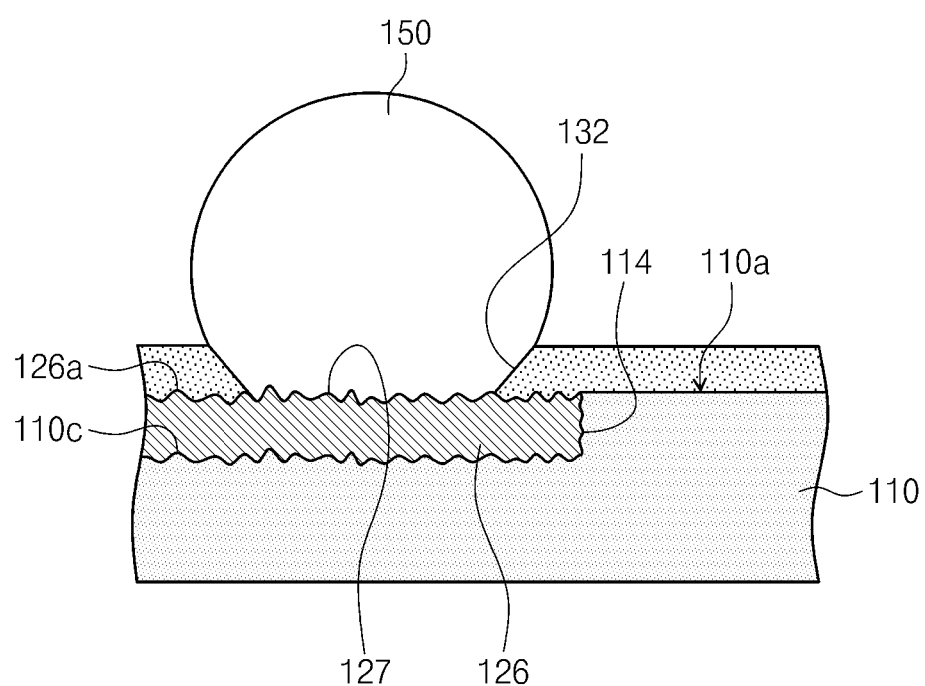
FIG. 4C is an enlarged sectional view of a portion of FIG. 2H.

FIGS. 4A through 4C are views illustrating a method of fabricating a semiconductor package according to an embodiment of the inventive concept. FIGS. 4A, 4B, and 4C are enlarged sectional views of respective portions of FIGS. 2D, 2F, and 2H.

Referring to FIG. 2A, a sustain board 101 is provided and a semiconductor chip 10 is attached to the sustain board 101. The top surface of the sustain board 101 is flat or stepped to provide an area to which the semiconductor chip 10 is attached. For example, a plurality of attachment parts 103 are formed on the top surface of the sustain board 101 to provide areas on which a plurality of semiconductor chips 10 are placed. The attachment parts 103 are disposed at equal intervals. A liquid adhesive is provided on the sustain board 10 to form an adhesive layer 105 on the attachment part 103. The adhesive layer 105 is a liquid adhesive layer comprising water as a solvent and a silicon base material as a substantial adhesive material. The adhesive layer 105 is a material having a relatively large viscosity not to flow away from the attachment part 103, and, instead, gathering on the attachment part 103. A plurality of semiconductor chips 10 are provided on the sustain board 101 having the adhesive layer 105. The plurality of semiconductor chips 10 determined as a good die during a test process are placed on the sustain board 101, in order to improve manufacturing and/or yield. The semiconductor chip 10 floats on the adhesive layer 105 and is positioned by the surface tension of the liquid adhesive layer 105. As another example, the adhesive layer 105 is provided in a solid film form on the attachment part 103.

The semiconductor chip 10 may be a memory chip, non-memory chip, or a combination thereof. The semiconductor chip 10 comprises a semiconductor substrate 11 including a top surface 11a having a bond pad 13 and a bottom surface 11b opposite to the top surface 11a, a passivation layer 15 and an insulation layer 17 formed on the top surface 11a. In the semiconductor substrate 11, the top surface 11a is an active surface and the bottom surface 11b is an inactive surface. When the semiconductor chip 10 is provided on the sustain board 101, the bottom surface 11b of the substrate 11 faces the attachment part 103. In accordance with an embodiment of the inventive concept, the bonding pads 13 of a semiconductor chip 10 are arranged in one row at the center of the semiconductor chip 10. As shown in the cross-sectional view of FIG. 2A, an insulation layer 17 has an opening 18 that exposes the bonding pad 13. A layer 19 formed of conductive material covering the bonding pad 13, is further formed in the opening 18. This layer 19 prevents the bonding pad 13 and the semiconductor chip 10 from being damaged by a laser during a laser drilling process. In this specification, the layer 19 is referred to as a laser stop layer. The laser stop layer 19 may be formed of conductive material such as metal, e.g., Cu or Ni. The laser stop layer 19 may be formed through a deposition, electroplating, or electroless plating method. According to this embodiment, the laser stop layer 19 is formed with a predetermined thickness (e.g., about 5 μm) through a Ni electroless plating method. As another example, the formation of the laser stop layer 19 may be omitted as described in more detail below.

Referring to FIG. 2B, a molding layer 110 molding the semiconductor chip 10 is formed on the sustain board 101. The molding layer 110 is formed with a thickness to cover a top of the semiconductor chip 10. The molding layer 110 may be an opaque layer of epoxy material or a transparent layer of silicon hybrid material (e.g., methyl silicon, phenyl silicon). According to this embodiment, the molding layer 110 is a transparent layer of silicon hybrid material. As described below, a groove may be formed in the molding layer 110. Accordingly, a top portion of the molding layer 110, from the top surface of the semiconductor chip 10 to the top surface of the molding layer 110, has a sufficient thickness to accommodate a groove region. For example, without intending to limit the embodiments of the inventive concept, a thickness T1 of the sustain board 101 is about 100 μm, a thickness T2 of the semiconductor chip 10 is about 500 μm, and a thickness T3 from the semiconductor chip 10 to the top surface of the molding layer 110 is about 80 μm.

Referring to FIG. 2C, a mold via hole 112 exposing the bonding pad 13 is formed by patterning the molding layer 110. For example, the mold via hole 112 is formed by selectively removing the molding layer 110 through a laser drilling process using laser 1. During a laser drilling process, a laser 1 may damage the bonding pad 13 or may penetrate the bonding pad 13 to damage the semiconductor chip 10. However, according to this embodiment, the laser stop layer 19 prevents the laser damage. The mold via hole 112 is formed with a vertically-recessed opening form having a section that is smaller toward the bottom of the opening. As one example, a size of the mold via hole 112 is identical or similar to, or is smaller than that of the opening 13. As one example, the mold via hole 112 has a critical dimension of about 30 µm. As another example, a mechanical drilling or etching process is used to form the mold via hole 112. During the laser drilling process, the laser 1 recognizes a position of the bonding pad 13. Accordingly, after recognizing a position of the bonding pad 13 by using light, a position on which the laser 1 is to be projected is set. Since the sustain board 101 is attached to the bottom surface 11b of the semiconductor chip 10, light is projected toward the top surface 11a of the substrate 11. According to this embodiment, since the molding layer 110 is a transparent layer of silicon hybrid material, recognizing a position of the bonding pad 13 by using light is facilitated.

Referring to FIG. 2D, grooves 114 are formed by patterning the molding layer 110. In accordance with an embodiment of the inventive concept, the grooves 114 are formed using the laser 1. For example, the grooves 114 recessed along the surface of the molding layer 110 are formed by moving the laser 1 horizontally and then selectively removing the molding layer 110. The grooves 114 are formed in a straight line and with bent portions as shown in FIG. 3C, or with all straight lines or all bending shapes, so that the grooves 114 may be connected to the molding via hole 112. In accordance with an embodiment of the inventive concept, the groove 114 has a recess pattern having a depth D of about 20 µm to about 30 µm, for example, which is smaller value than the thickness T3 of FIG. 2B from the semiconductor chip 10 to the top surface of the molding layer 110. As shown in FIG. 4A, an outer surface 110a constituting the top surface of the molding layer 110 and an inner surface 110c of the molding layer 110 constituting the bottom surface of the groove 114 have respectively different surface textures. For example, the outer surface 110a of the molding layer 110 is smooth and flat and the inner surface 110c is rough and uneven.

Figure 2E:
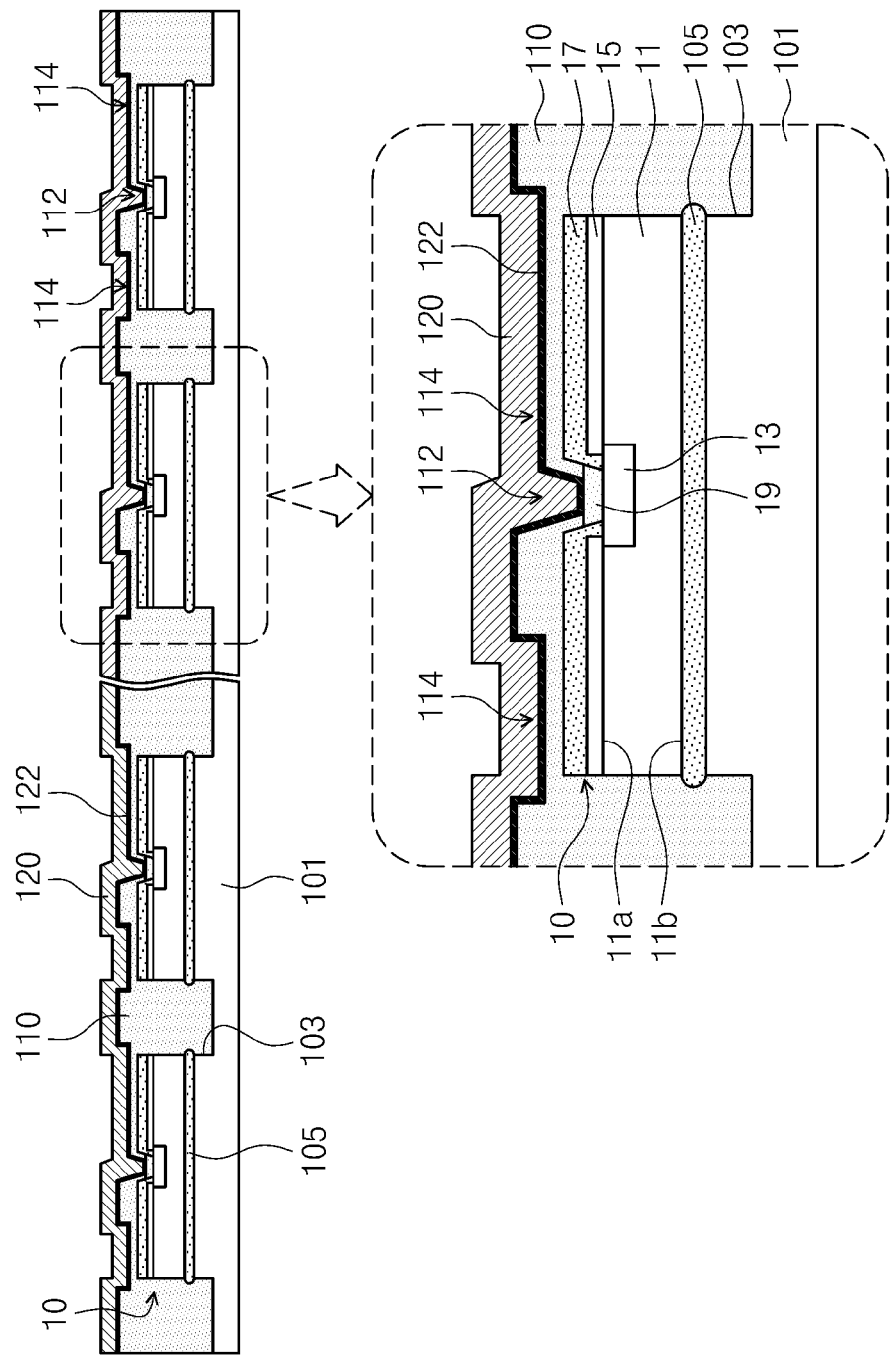

Referring to FIG. 2E, a conductive layer 120 is formed on the semiconductor chip 10. For example, the conductive layer 120 is formed by depositing or plating metal such as Cu, Al, Ni, or combinations (e.g., Cu/Ni) thereof. According to this embodiment, the conductive layer 120 is formed using an electroplating method. When electroplating is used, although the conductive layer 120 may be formed on the top surface of the electrically conductive laser stop layer 19 or the top surface of the electrically conductive bonding pad 13, the conductive layer 120 is not able to be formed on the top surface of the molding layer 110, which is not electrically conductive. Accordingly, prior to forming the conductive layer 120, a seed layer 122 is formed to cover the semiconductor chip 10. The seed layer 122 is formed by depositing or plating metal. According to this embodiment, the seed layer 122 is formed using an electroless plating method. When the seed layer 122 is formed through an electroplating method, it is not able to be formed on the top surface of the molding layer 110. Accordingly, the seed layer 122 is formed using an electroless plating method. As one example, the seed layer 122 is formed through an electroless plating method of Cu. As another example, the seed layer 122 is formed through an electroless plating method of Ni to combine with the bonding pad 13 or the laser stop layer 19. In accordance with an embodiment of the inventive concept, the seed layer 122 is formed to have a thickness of about 0.1 µm to about 0.5 µm, for example, about 0.3 µm. The conductive layer 120 is formed with a sufficient thickness so that the conductive layer is higher than the top surface of the molding layer 110.

Figure 3D:
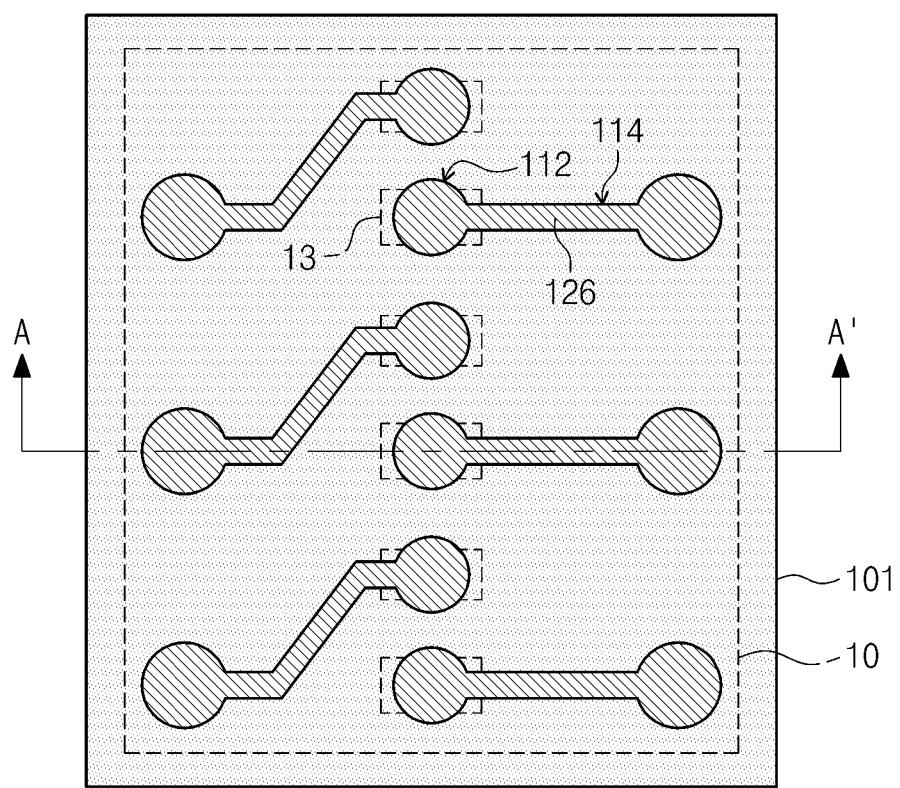
FIG. 3D is a plan view illustrating a portion of FIG. 2F.

Referring to FIG. 2F, a routing pattern 126 is formed by selectively removing the conductive layer 120. The conductive layer 120 is selectively removed by using a chemical mechanical polishing, etch back or grinding method. The conductive layer 120 is selectively removed to expose at least the top surface of the molding layer 110. At this point, a portion of the seed layer 122, for example, the portion formed on a on the top surface of the molding layer 110, and not the portion in the groove 114 and in the mold via hole 112, is selectively removed. Due to the selective removal of the conductive layer 120, a thickness of the conductive layer 120 is reduced, so that the routing pattern 126 fills the groove 114 and the mold via hole 112. The routing pattern 126, as shown in FIG. 3D, is electrically connected to the bonding pad 13 through the mold via hole 112. The routing pattern 126 has a thickness, for example, about 20 µm to about 30 µm, corresponding to the depth D of the groove 114 as shown in FIG. 2D.

When the routing pattern 126 is formed by polishing the conductive layer 120, as shown in FIG. 4B, the surface 126a of the polished routing pattern 126 is uneven. The top surface 110a of the molding layer 110 is polished together with the routing pattern 126. Since the routing pattern 126 is, for example, formed of metallic material and the molding layer 110 is, for example, formed of polymer material, the surface 126a of the routing pattern 126 after polishing is rougher than the top surface 110a of the molding layer 110. As one example, the conductive layer 120 is formed of the same material as the seed layer 122. As another example, the conductive layer 120 is formed of different material than the seed layer 122. Since routing pattern comprises the seed layer 122 illustration of the seed layer is omitted in the drawings hereinafter.

Figure 2G:
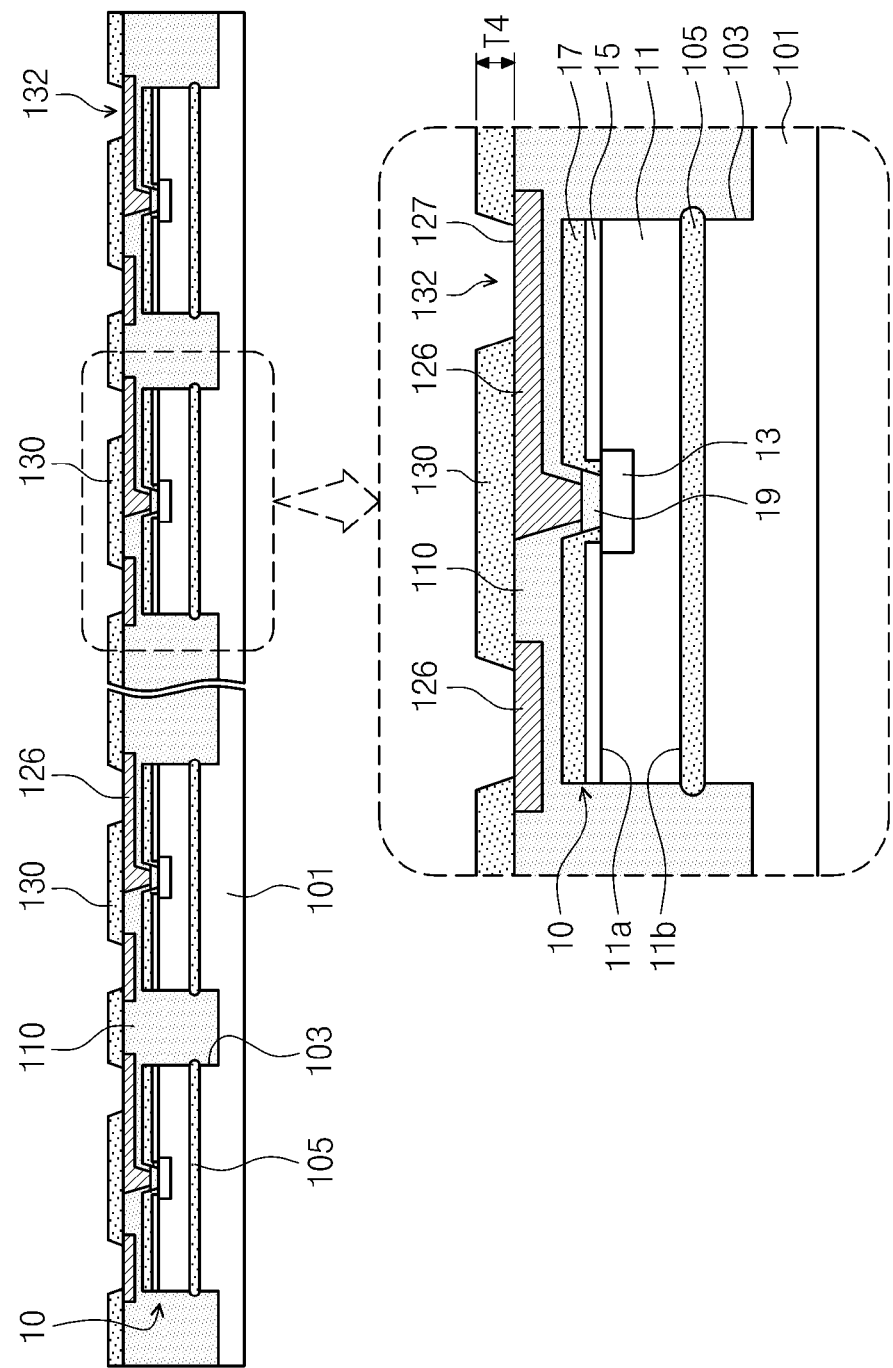

Referring to FIG. 2G, a solder mask 130 is formed on the molding layer 110 to define a region to which an external terminal is attached. For example, the solder mask layer 130 includes an opening 132 exposing a portion 127 of the routing pattern 126. The portion 127 of the routing pattern 126 is defined as a ball land providing an area to which an external terminal, such as a solder ball is attached. The opening 132 is, for example, disposed at an edge of the semiconductor chip 10. In accordance with an embodiment of the inventive concept, the solder mask layer 130 is formed by coating a solder resist and then patterning the solder resist through a photo process. In accordance with another embodiment of the inventive concept, the solder mask layer 130 is formed through a screen printing method or roll-to-roll method without using a photo process. When the solder mask layer 130 is formed through a screen printing or roll-to-roll method instead of a photo process, loss of a solder resist is less and low manufacturing costs may be realized because equipment, such as photo equipment, is unnecessary. The screen printing and roll-to-roll methods are described below with reference to FIGS. 8A and 8B. According to this embodiment, the solder mask layer 130 is formed to have a thickness T4 of about 10 µm through a screen printing method.

The sustain board 101 is selectively removed from the semiconductor chip 10. During removal of the sustain board 101, the adhesive layer 105 is also removed. The sustain board 101 is removed before or after the forming of the solder mask layer 130. Once the sustain board 101 is removed, the bottom surface 11b of the substrate 11 is exposed, so that a molding layer may be further formed to cover the bottom surface 11b of the substrate 11 to protect the semiconductor chip 10 from external environments.

Referring to FIG. 2H, a solder ball 150 as an external terminal is formed on the semiconductor chip 10. For example, the solder ball 150 is attached to the ball land 127 so that the solder ball 150 is electrically connected to the bonding pad 13 via the routing pattern 126. As shown in FIG. 4C, the surface 126a of the routing pattern 126 is uneven and thus the ball land 127 is also uneven. According to this embodiment, compared to if the surface 126a of the routing pattern 126 is smooth, since the boundary between the uneven routing pattern 126 and the solder ball 150 is uneven, contact area is increased. Accordingly, solder joint reliability (SJR) is improved.

After or before forming the solder ball 150, the semiconductor chips 10 are sliced into pieces along scribe lines 142 by using a laser or a cutter. Accordingly, the semiconductor package 100 as shown in FIG. 1A, where the semiconductor chip 10 is attached to the sustain board 101, is formed. According to an embodiment, the semiconductor package 100 is formed with a fan-in structure without the forming a PCB and a bonding wire. In accordance with another embodiment of the inventive concept, the semiconductor package 100 having a fan-out structure is formed by expanding the routing pattern 126 to the outside of the semiconductor chip 10 and contacting an external terminal 150 on the expanded routing pattern 126.

Figure 5A:
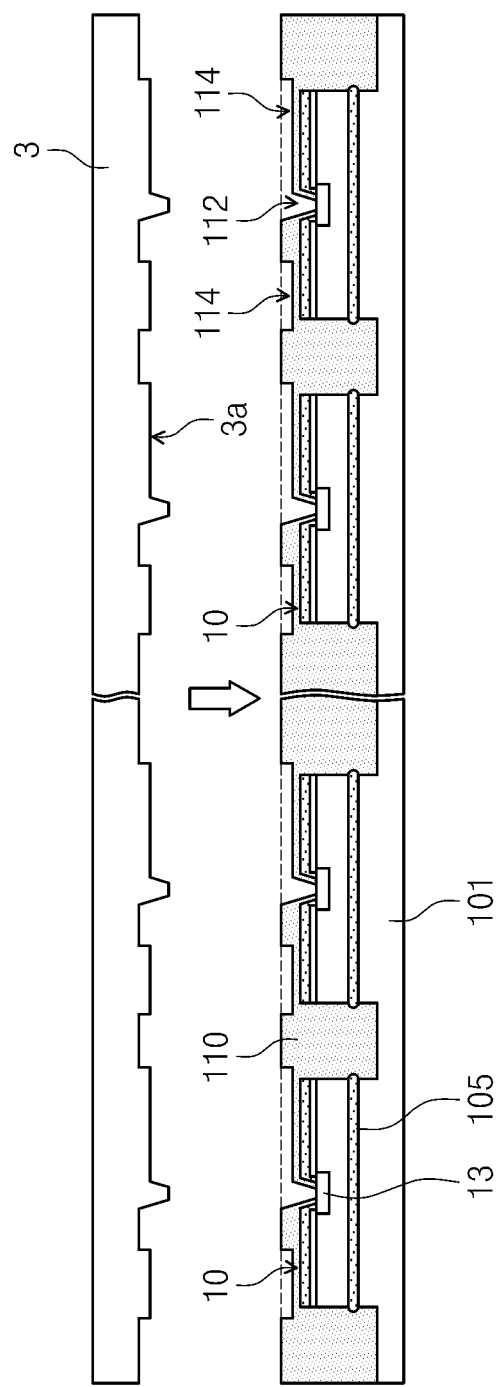
Figure 5C:
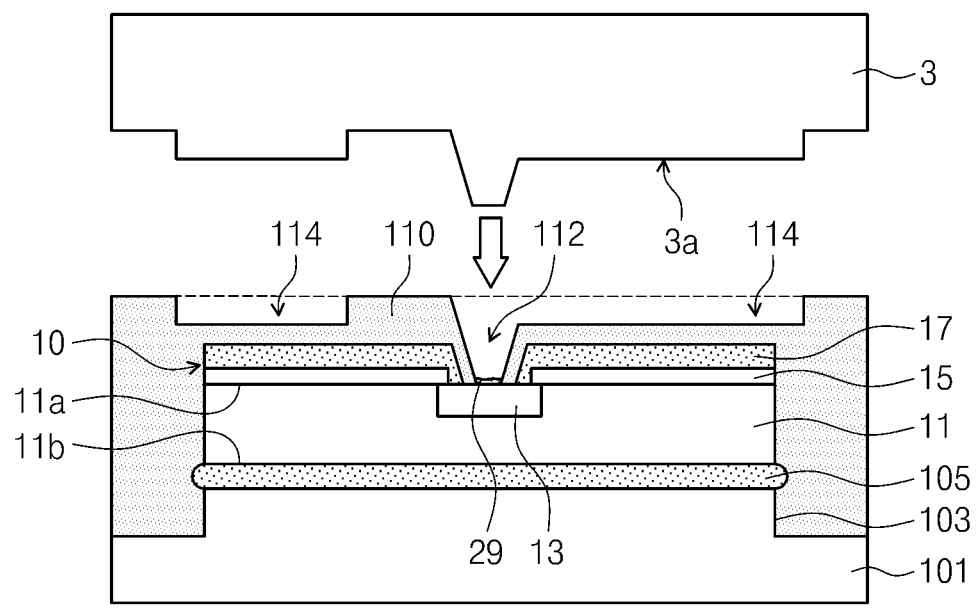

FIGS. 5A through 5C are sectional views illustrating a process of groove formation in a method of fabricating a semiconductor package according to an embodiment of the inventive concept.

Referring to FIG. 5A, after a plurality of semiconductor chips 10 are mounted on a sustain board 101 and a molding layer 110 is formed, a mold via hole 112 and a groove 114 are formed in the molding layer 110 by using a dent device 3. The dent device 3 includes an embossed part 3a having a protrusions that correspond to the mold via hole 112 and the groove 114. For example, the dent device 3 is aligned on the top of the sustain board 101 and is transferred downward to apply pressure on the molding layer 110. As a result, the mold via hole 112 and the groove 114 are simultaneously formed on the molding layer 110 based on the shape of the embossed part 3a. The dent device 3 may have an identical or similar size to or a smaller size than the sustain board 101. Accordingly, the dent device 3 may process or work all the semiconductor chips 10 or some of the semiconductor chips 10.

If the molding layer 110 is hardened, pressure applied to the dent device 3 needs to be increases and accordingly, there is a possibility that mechanical damage may occur at the semiconductor chip 10. In addition, due to the hardening of the molding layer 110, the mold via hole 112 and the groove 114 may not be formed or may be formed without an intended form or depth. Accordingly, according to an embodiment, before the hardening of the molding layer 110, the semiconductor chips 10 is processed using the dent device 3. Since this embodiment does not use a laser, the laser stop layer 19 of FIG. 2A does not need to be formed. As an example, the molding layer 110 is formed of transparent material being identical or similar to FIG. 1A in order to recognize a position of the bonding pad 13 by using light.

Referring to FIG. 5B, a dent device 4 may have a size for simultaneously forming the mold via hole 112 and the groove 114 in one semiconductor chip 10. Similar to the dent device 3, the dent device 4 includes an embossed part 4a having protrusions that correspond to the mold via hole 112 and the groove 114. According to an embodiment, the dent device 4 is horizontally moved to process each of the semiconductor chips 10.

Referring to FIG. 5C, since the dent device 3 does not remove the molding layer 110, a residue 29 of the molding layer 110 may remain in the mold via hole 112 and/or the groove 14. In accordance with an embodiment of the inventive concept, since the residue 29 in the mold via hole 112 may disturb an electrical connection between the bonding pad 13 and the routing pattern 126 of FIG. 2H, the residue 29 is removed. A cleansing process for the semiconductor chip 10 may be used to remove the residue 29.

Figure 6B:
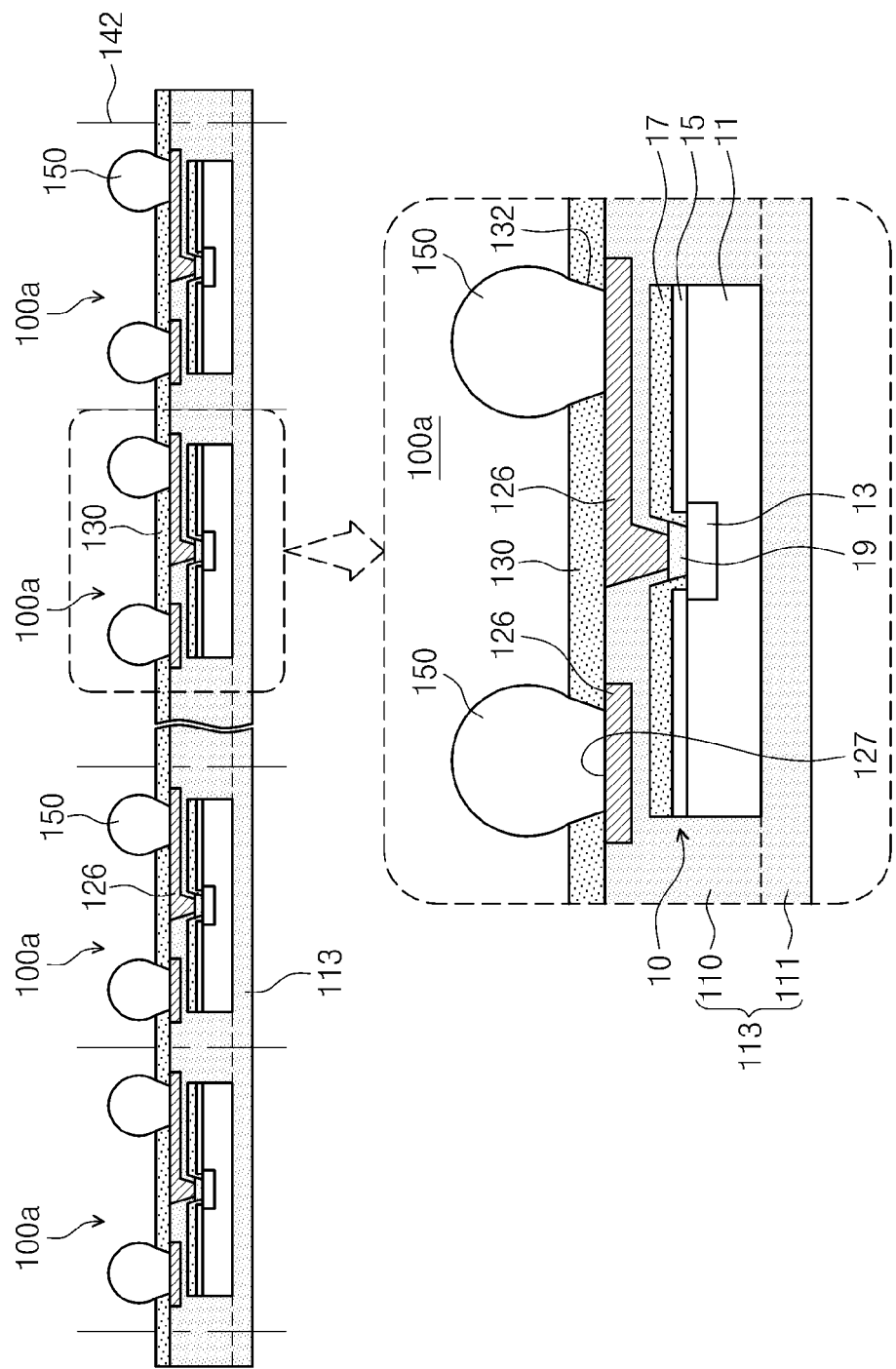

FIGS. 6A and 6B are sectional views illustrating a method of fabricating a semiconductor package according to an embodiment of the inventive concept.

Referring to FIG. 6A, a plurality of semiconductor chips 10 are mounted on a sustain board 101 and after forming a molding layer 110, the sustain board 101 is removed. During removal of the sustain board 101, an adhesive layer 105 is also removed. Even if the sustain board 101 is removed, the semiconductor chips 10 is sustained by the molding layer 110. Once the sustain board 101 is removed, the bottom surface 11b of the substrate 11 is exposed. Selectively, a bottom molding layer 111 covering the bottom surface 11b of the substrate 11 is further formed to protect the semiconductor chip 10 from external environments. The bottom molding layer 111 includes a molding layer 113 together with the molding layer 110. In accordance with an embodiment of the inventive concept, the molding layer 113 completely surrounds the semiconductor chip 10.

Referring to FIG. 6B, a routing pattern 126, a solder mask 130 having an opening 132 that exposes a ball land 127, and a solder ball 150 contacting the ball land 127 are formed through identical or similar processes described with reference to FIGS. 2C through 2G. Then, the semiconductor chips 10 are separated by slicing the molding layer 113 along scribe lines 142. According to this embodiment, the semiconductor package 100c shown in FIG. 1C, including the semiconductor chip 10 that is completely covered by the molding layer 113, is formed.

Figure 7B:
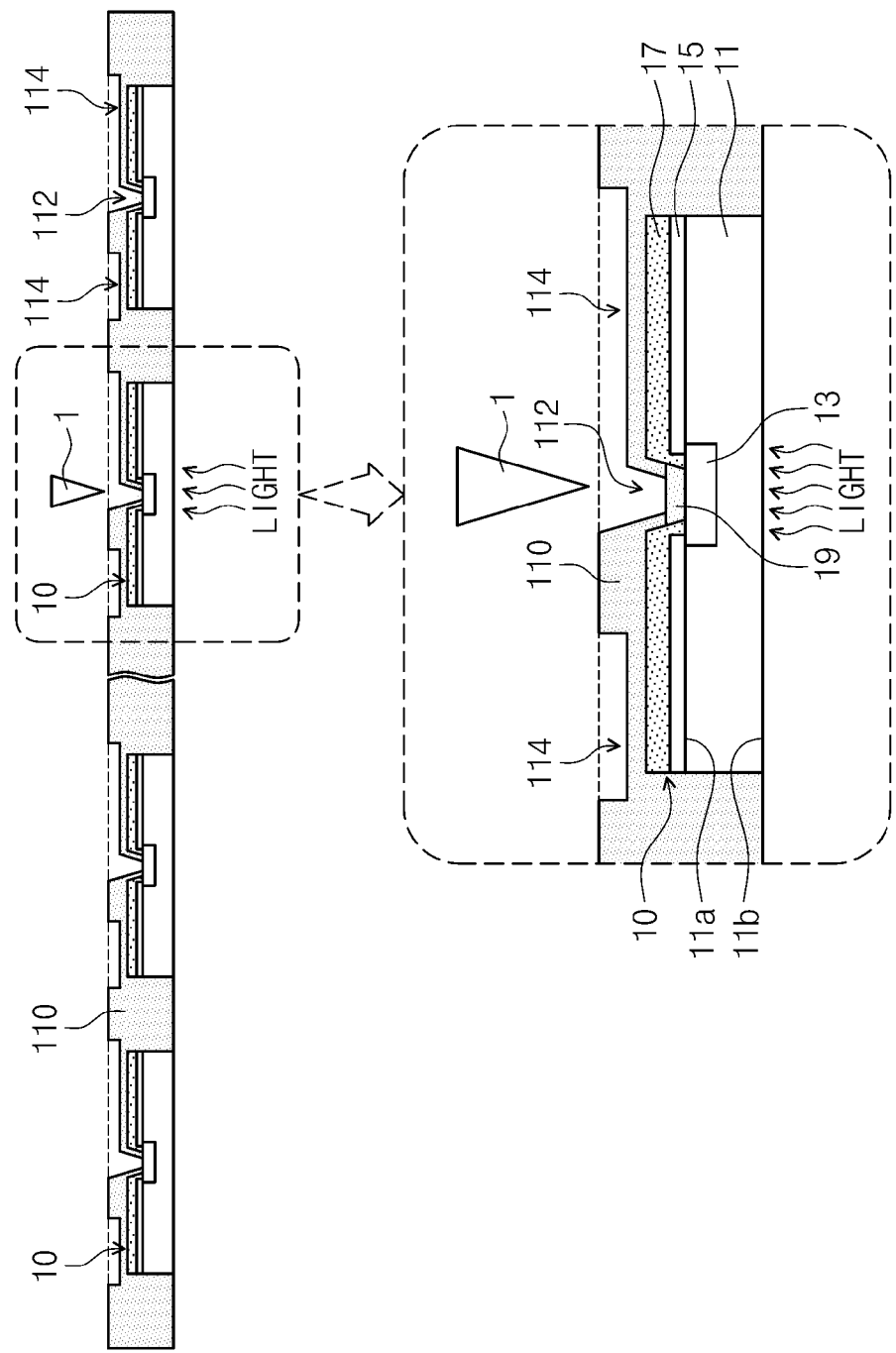

FIGS. 7A and 7B are sectional views illustrating molding layer formation in a method of fabricating a semiconductor package according to an embodiment of the inventive concept.

Referring to FIG. 7A, a plurality of semiconductor chips 10 are mounted on a sustain board 101 and after forming of a molding layer 110, the sustain board 101 and an adhesive layer 105 are simultaneously removed. Due to the removal of the sustain board 101, the bottom surface 11b of a substrate 11 is exposed. In accordance with embodiments of the inventive concept, a molding layer 110 may be an opaque layer formed of epoxy material or a transparent layer formed of silicon hybrid material. According to this embodiment, regardless of transparency of the molding layer 110, the molding layer 110 is formed of any material that may be used for molding the semiconductor chip 10. Additionally, the molding layer 110 is not limited in color and may, for example, adopt a black color based molding material.

Referring to FIG. 7B, a mold via hole 112 and a groove 114 are formed by patterning the molding layer 110. The molding layer 110 is patterned using a laser drilling process using a laser 1. During the laser drilling process, the laser 1 is aligned with the bonding pad 13. According to this embodiment, since the bottom surface 11b of the substrate 11 is exposed, light may be projected from the bottom of the semiconductor chip 10 in order to recognize a position of the bonding pad 13. According to this embodiment, since light is projected from the bottom of the semiconductor chip 10 and not from the top, the material or color of the molding layer 110 is not limited. As another example, when the molding layer 110 is formed of a transparent layer, light may be projected from above the semiconductor chip 10. After the laser drilling process, a bottom molding layer covering the bottom surface 11b of the substrate 11 may be further formed as shown in FIG. 6A. Next, the semiconductor package 100a shown in FIG. 1C is formed through identical or similar processes described with reference to FIG. 6B.

FIGS. 8A and 8B are sectional views illustrating a method of forming a solder mask layer in a method of fabricating a semiconductor package according to an embodiment of the inventive concept.

Referring to FIG. 8A, a solder mask layer 130 is formed using a screen printing method. For example, a mesh mask 50 formed of plastic or stainless steel and having a plurality of openings 50a is disposed on a semiconductor chip 10, and then a solder resist 129 is provided on the mesh mask 50. In the mesh mask 50, positions and forms of the openings 50a match position and forms of the solder mask layers 130. A squeegee 52 is moved along the mesh mask 50 and applies pressure to the solder resist 129 to dispose the solder resist 129 on the semiconductor chip 10 through the openings 50a, so that the solder mask layer 130 may be formed.

Referring to FIG. 8B, the solder mask layer 130 is formed through a roll-to-roll method. For example, by simultaneously rotating a roller 60 having a solder resist 129 on the outer circumference of the roller and moving the roller 60 to the arrow direction and/or moving the sustain board 101 in a direction opposite to the arrow direction, the solder resist 129 is provided on the semiconductor chip 10. Accordingly, a solder mask layer 130 is formed on the semiconductor chip 10.

Figure 9A:
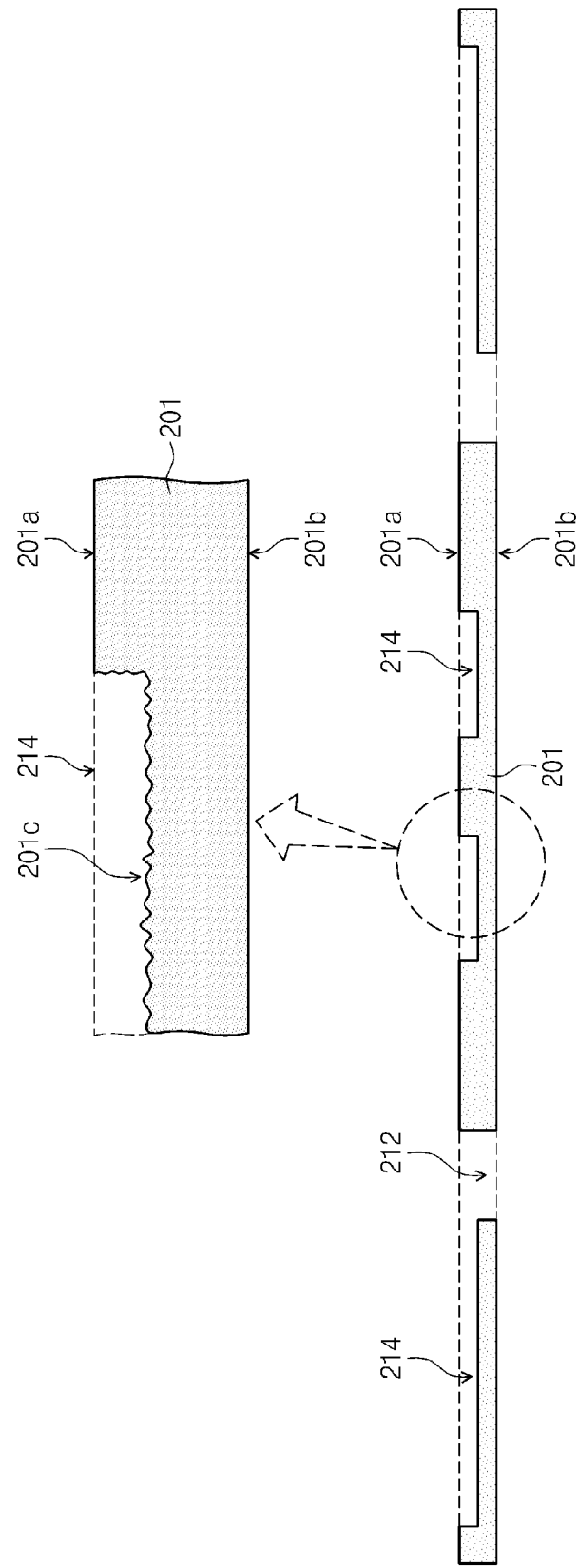
Figure 9B:
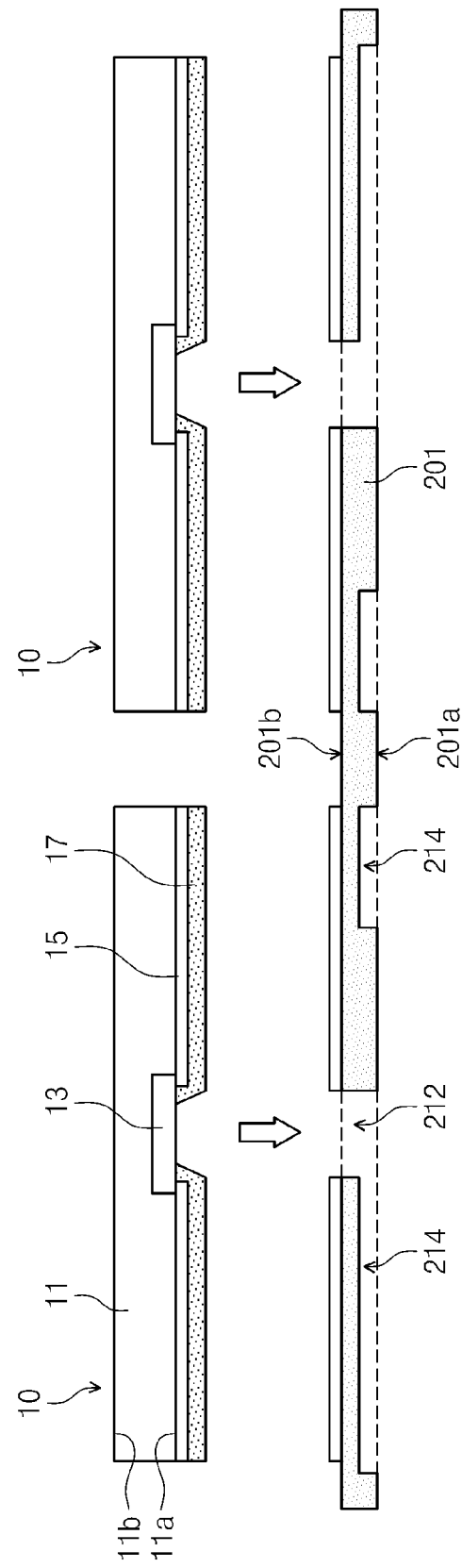
Figure 9C:
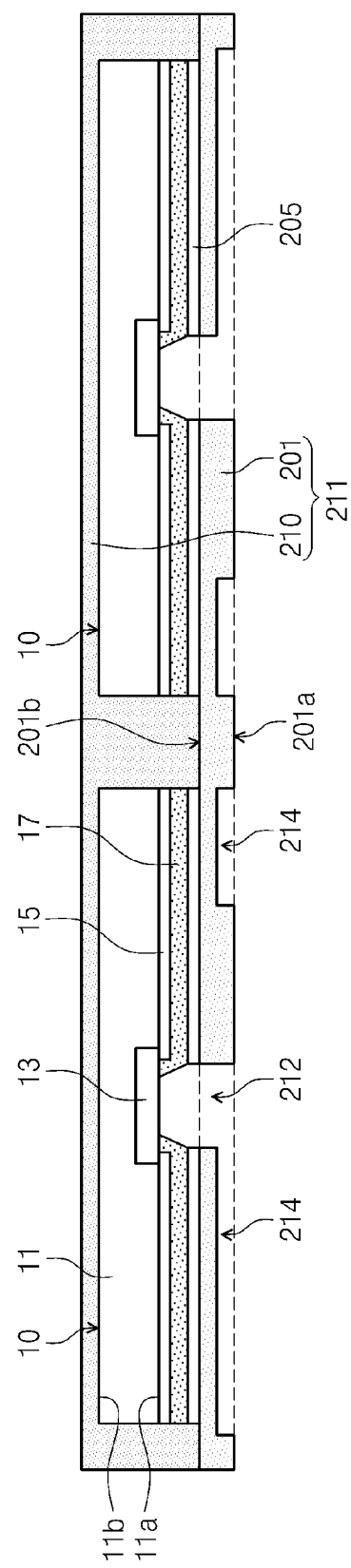
Figure 9E:
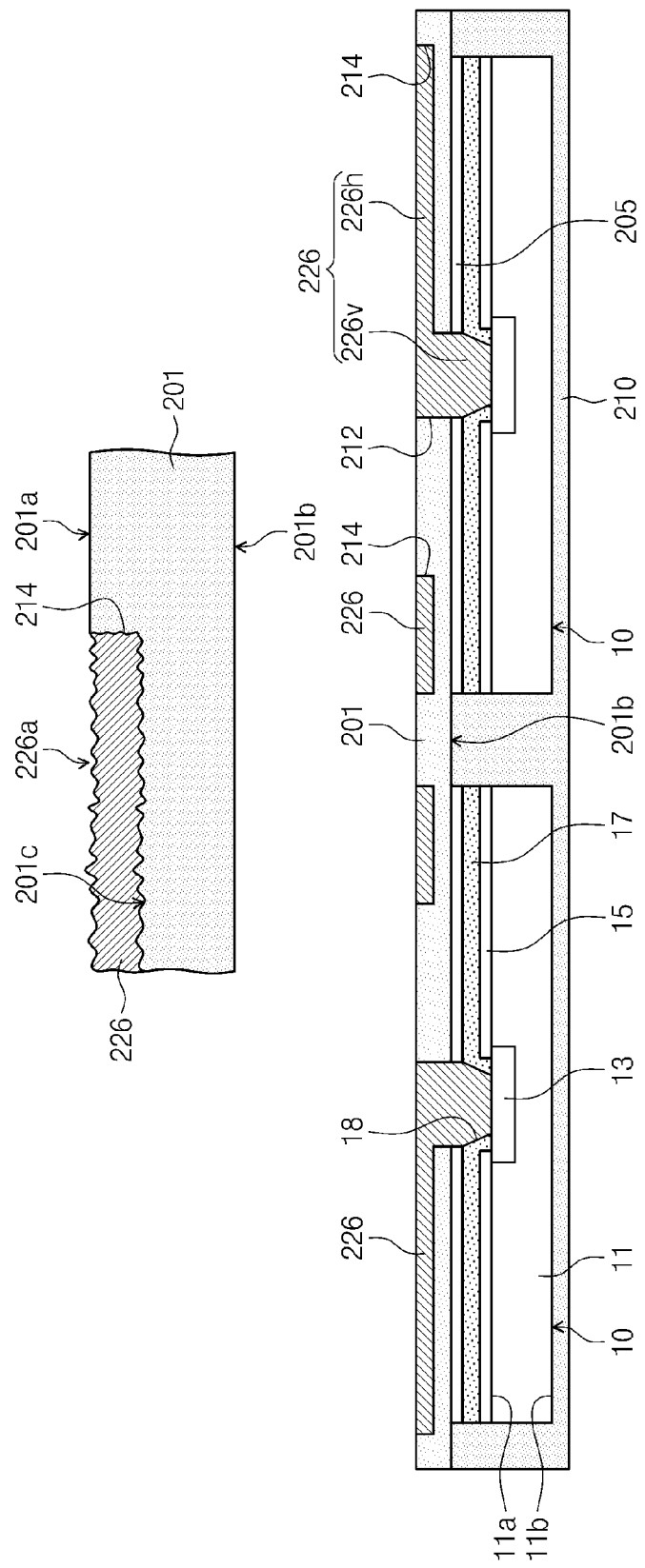
Figure 10A:
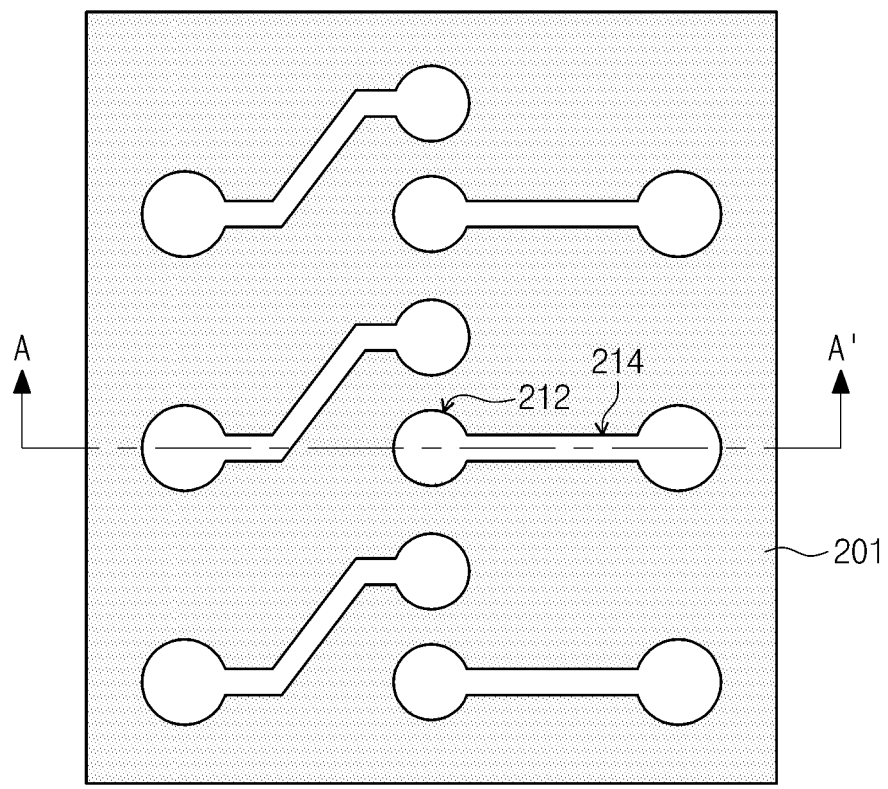
FIG. 10A is a plan view illustrating a portion of FIG. 9A.
Figure 10B:
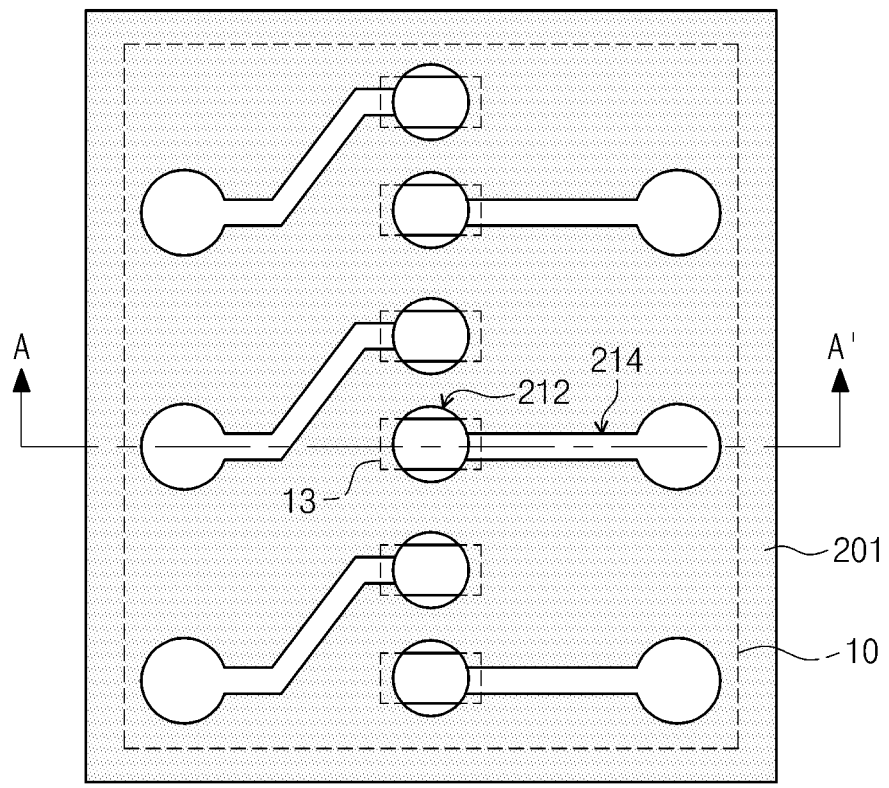
FIG. 10B is a plan view illustrating a portion of FIG. 9B.
Figure 10C:
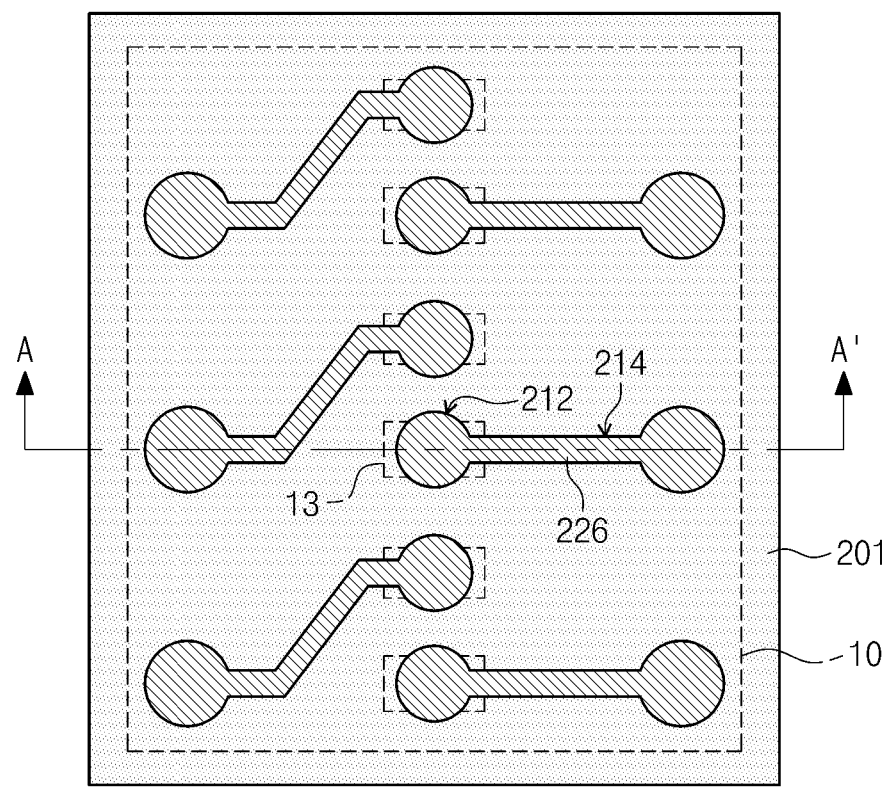
FIG. 10C is a plan view illustrating a portion of FIG. 9E.

FIGS. 9A through 9F are sectional views illustrating a method of fabricating a semiconductor package according to an embodiment of the inventive concept. FIGS. 10A through 10C are views illustrating a method of fabricating a semiconductor package according to an embodiment of the inventive concept. FIGS. 10A, 10B, and 10C are plan views illustrating portions of FIGS. 9A, 9B, and FIG. 9E, respectively. FIGS. 9A, 9B, and 9E are sectional views taken along the lines A-A' of FIGS. 10A, 10B, and 10C, respectively. Hereinafter, descriptions different from FIGS. 2A through 2H are described in more detail and identical or similar descriptions to FIGS. 2A through 2H are omitted or briefly described.

Referring to FIG. 9A, a molding substrate 201 having a top surface 201a and a bottom surface 201b is provided. It is to be understood that the top surface 201a and the bottom surface 201b can be defined reversely according to a viewing direction. In accordance with an embodiment of the inventive concept, the molding substrate 201 is formed of polymer having a pigment that is amenable to laser-processing. A plurality of via holes 212 and grooves 214 are formed by processing the molding substrate 201. As shown in FIG. 10A, the via holes 212 are arranged in one row at the center of the molding substrate 201 and the grooves 214 are formed in a straight line and with bent forms to be connected to the mold via holes 212. The via holes 212 and the grooves 214 are formed through, for example, a laser drilling or sand blast process. According to this embodiment, the top surface 201a and the bottom surface 201b of the molding substrate 201 may have different surface textures from the inner surface 210c of the molding substrate 201, which constitutes the bottom surface of the groove 214. For example, the top surface 201a of the molding substrate 201 is smooth, but the inner surface 201c is rough. The molding substrate 201 is formed of an identical or similar material to or a different material from a resin layer 210 described below.

Referring to FIG. 9B, the molding substrate 201 is reversed to have the bottom surface 201b facing upward and the top surface 201a facing downward and then the plurality of semiconductor chips 10 in a face down position, are placed on the bottom surface 201b of the molding substrate 201. For example, after an adhesive layer 205 is coated on the bottom surface 201b of the molding substrate 201, the top surface 11a of the semiconductor substrate 11 faces down and the semiconductor chip 10 is then mounted on the bottom surface 201b of the molding substrate 201. A polymer having adhesive properties may form the adhesive layer 205 through a screen printing or roll-to-roll method, or an adhesive film may be attached to the bottom surface 201b of the molding substrate 201. In this case, since the via hole 212 of the molding substrate corresponds to the opening 18 of the semiconductor chip 10 in the vertical direction, the bonding pad 13 is exposed through the via hole 212.

The semiconductor chip 10 is configured identically or similar to that of FIG. 2A. For example, the semiconductor chip 10 may be a memory chip, non-memory chip, or a combination thereof. The semiconductor chip comprises a semiconductor substrate 11 including a top surface 11a on which a bonding pad 13 is formed and a bottom surface 11b facing the top surface 11a, a passivation layer 15 and an insulation layer 17 disposed on the top surface 11a of the semiconductor substrate 11. An opening 18 exposing the bonding pad 13 is formed in the insulation layer 17. The bonding pads 13 are arranged in one row at the center of the semiconductor chip 10. A 1:1 corresponding structure of the bonding pads 13 and the via holes 212 is shown in FIG. 10B. According to this embodiment, there is no need to perform a process for directly projecting laser on the semiconductor chip 10. As a result, no laser damage occurs at the semiconductor chip 10, and, unlike FIG. 2A, the semiconductor chip 10 does not include the laser stop layer 19.

Referring to FIG. 9C, a resin layer 210 for molding the semiconductor chips 10 is formed on the bottom surface 201b of the molding substrate 201. The resin layer 210 may be an opaque layer of epoxy material or a transparent layer of silicon hybrid material (e.g., methyl silicon, phenyl silicon). According to this embodiment, there is no need to process the resin layer 210, so the resin layer 210 is not limited to material types or certain colors. The resin layer 210 covers the side and bottom surfaces of the semiconductor chip 10, and the molding substrate 201 covers the top surface of the semiconductor chip 10. Accordingly, the resin layer 210 and the molding substrate 201 constitute the molding layer 211 for molding the semiconductor chip 10.

Referring to FIG. 9D, a seed layer 222 and a conductive layer 220 are sequentially formed on the semiconductor chip 10. For example, after reversing the molding substrate 201 to have the top surface 201a facing upward, the seed layer 222 is formed through an electroless plating method using metallic material such as Ni or Cu. Accordingly, the seed layer 222 may be formed all over the top surface of the bonding pad 13 and the top surface 201a of the molding substrate 201. Then, the conductive layer 220 is formed on the seed layer 222 through metal deposition or plating. For example, the conductive layer 220 is formed by electroplating Cu, Al, Ni, or Cu/Ni. The conductive layer 220 is formed to have a sufficient thickness to cover the entire semiconductor chips 10.

Referring to FIG. 9E, a routing pattern 226 is formed by selectively removing the conductive layer 220 and the seed layer 222 using a chemical mechanical polishing, etch back or grinding method. Due to the selective removal, a thickness of the conductive layer 220 is reduced so that the routing pattern 226 is formed to have a vertical pattern 226v filling the via hole 212 and a horizontal pattern 226h filling the groove 214. The vertical pattern 226v, such as a stud bump that is directly connected to the bonding pad 13 through the via hole 212, has a structure that completely fills the via hole 212. The routing pattern 226 is formed on the rough inner surface 201c of the molding substrate 201 through a plating method. During the polishing process of the conductive layer 220, due to a difference in material from the molding substrate 201, the surface 226a of the routing pattern 226 is formed to be rough. A plan view of the routing pattern 226 is shown in FIG. 10C.

Referring to FIG. 9F, a solder mask layer 230 defining a ball lands 227 is formed and solder balls 250 contacting the ball lands 227 are formed. As one example, the solder mask layer 230 having an opening 232 that defines the ball land 227 is formed through a photo process, the screen printing of FIG. 8A or the roll-to-roll method of FIG. 8B. Since the surface 226a of the routing pattern 226 is rough, the surface of the ball land 227 is also rough. Accordingly, since a contact area between the rough routing pattern 226 and the solder ball 250 is enlarged, solder joint reliability (SJR) is improved. After or before the forming of the solder balls 250, the semiconductor chips 10 may be sliced into pieces along a scribe line 242 by using laser or a cutter. Accordingly, the semiconductor package 200 of FIG. 1H may be formed.

Figure 11A:
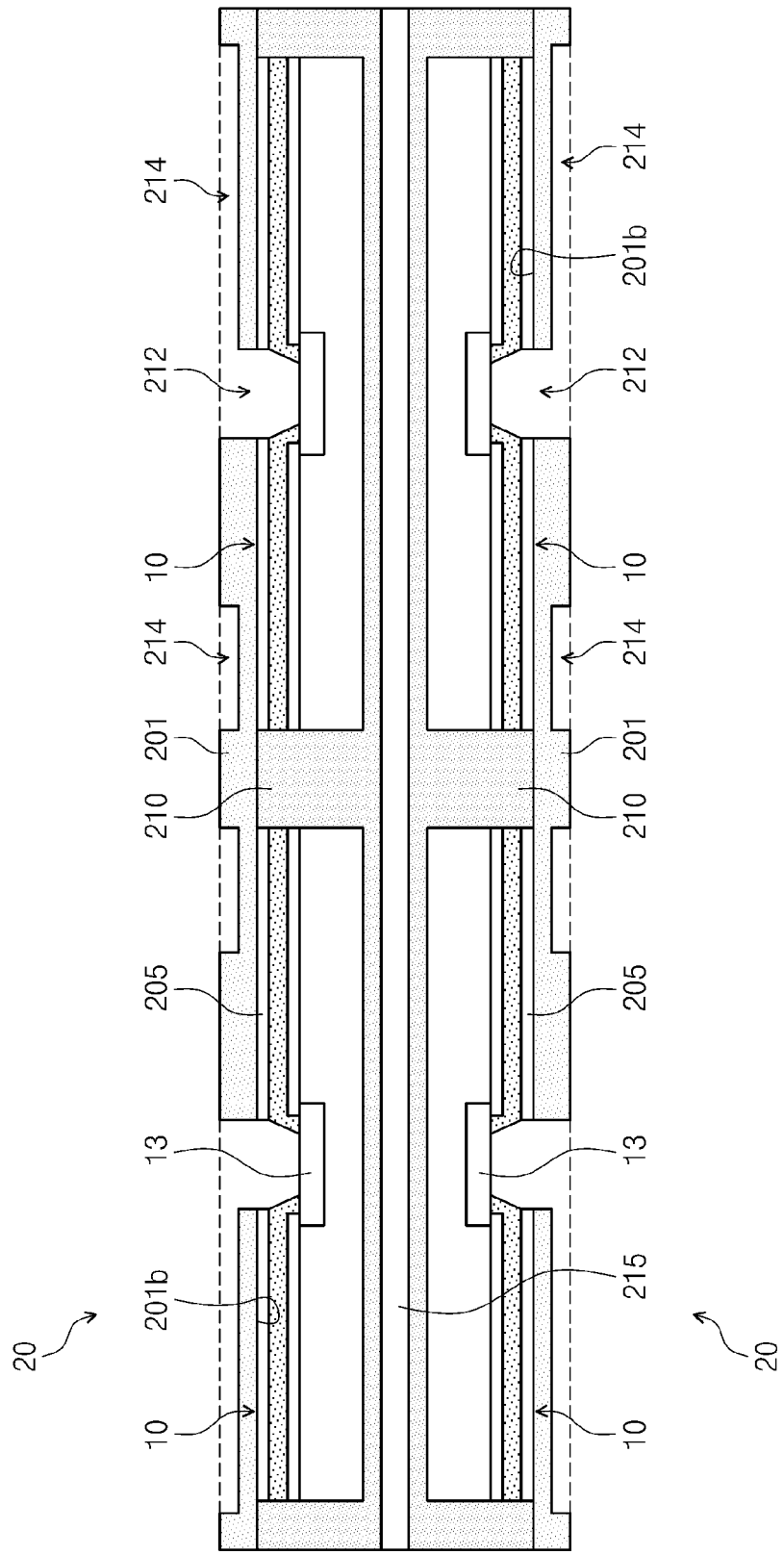

FIGS. 11A and 11B are sectional views illustrating a method of fabricating a semiconductor package according to an embodiment of the inventive concept.

Referring to FIG. 11A, with an identical or similar process as described with reference to FIGS. 9A through 9C, structures 20, where semiconductor chips 10 are attached on the bottom surfaces 201b of molding substrates 201 and resin layers 210 for molding the semiconductor chips 10 are formed, are joined together. For example, a double coated adhesive layer 215 is interposed between the molding layers 210 to join two structures 20 together.

Referring to FIG. 11B, seed layers 222 and conductive layers 220 are formed in the joined two structures 20 through an identical or similar process as described with reference to FIG. 9D. For example, the seed layers 222 are formed through electroless plating of Ni or Cu and the conductive layers 220 are formed through electroplating of Cu. According to this embodiment, since a dual sided plating process is able to be performed, TAT (turn around time) may be reduced. After separating the two structures 20, the semiconductor package 200 of FIG. 1H may be formed through an identical or similar process as described with reference to FIGS. 9E and 9F.

The dual sided plating process may be applicable to the embodiments described with reference to FIGS. 2A through 2H. For example, after two sustain boards 101 having the semiconductor chip 10 attached in FIG. 2E are attached to each other, the seed layer 122 and the conductive layer 120 may be plated on each molding layer 110.

Figure 12A:
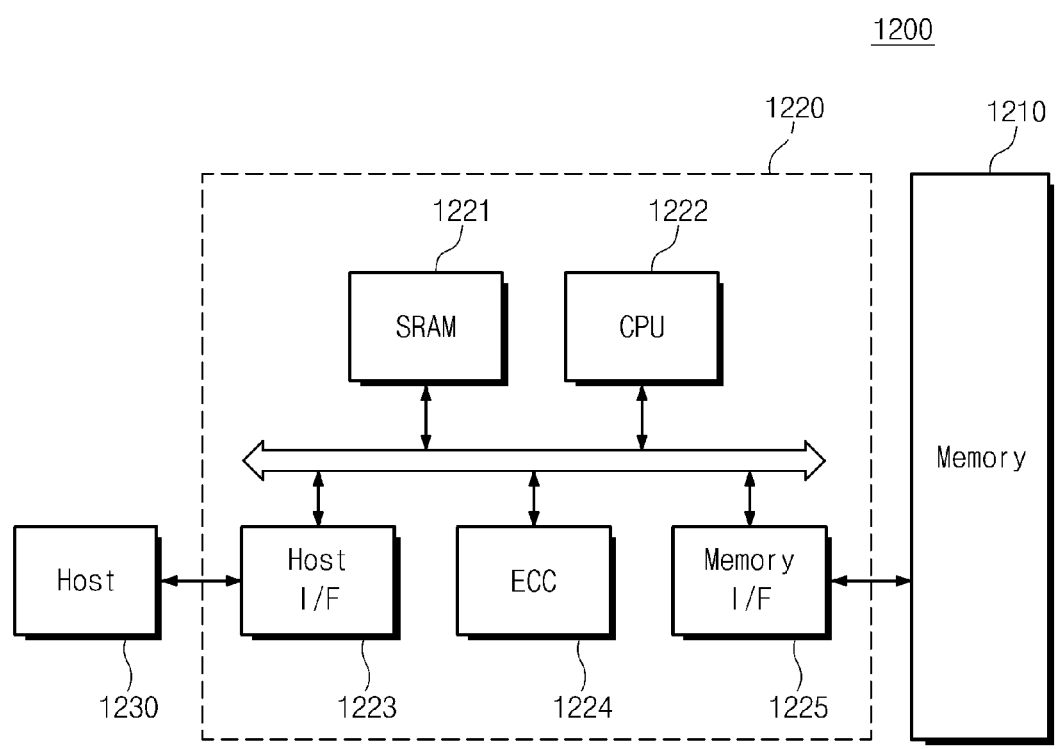
FIG. 12A is a block diagram illustrating a memory card with a semiconductor package according to embodiments of the inventive concept.

FIG. 12A is a block diagram illustrating a memory card with a semiconductor package according to embodiments of the inventive concept.

Referring to FIG. 12A, a semiconductor memory 1210 including the semiconductor package according to embodiments of the inventive concept is applied to a memory card 1200. As one example, the memory card 1200 includes a memory controller 1220 controlling general data exchange between a host and a memory 1210. An SRAM 1221 may be used as an operating memory of a central processing unit (CPU) 1222. A host interface 1223 includes a data exchange protocol of a host connected to the memory card 1200. An error correction code (ECC) 1224 detects and corrects errors in data read from the memory 1210. A memory interface 1225 interfaces with the memory 1210. The CPU 1222 performs general control operations for data exchange with a memory controller 1220.

Figure 12B:
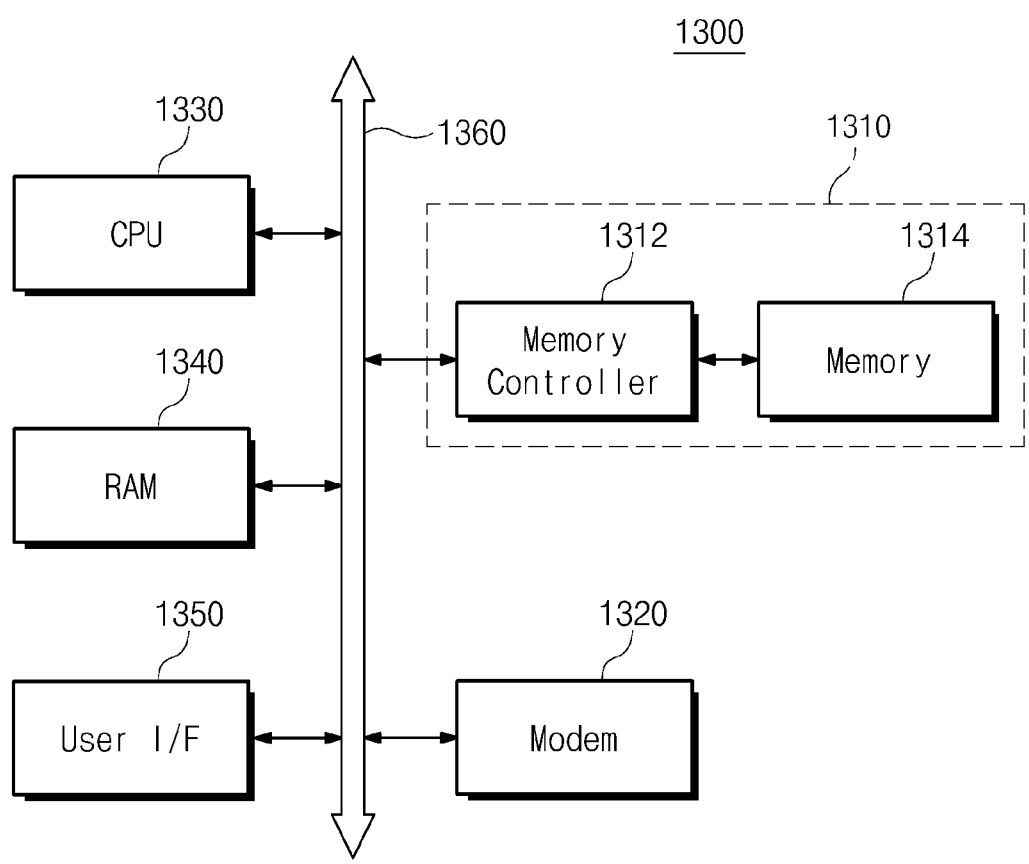
FIG. 12B is a block diagram illustrating an information processing system having a semiconductor package according to embodiments of the inventive concept.

FIG. 12B is a block diagram illustrating an information processing system having an applied semiconductor package according to embodiments of the inventive concept.

Referring to FIG. 12B, the information processing system 1300 includes a memory system 1310 according to embodiments of the inventive concept. The information processing system 1300 may include a mobile device or a computer. As one example, the information processing system 1300 includes a memory system 1310, a modem 1320, a CPU 1330, a RAM 1340, and a user interface 1350, which are electrically connected to a system bus 1360. The memory system 1310 includes a memory 1314 and a memory controller 1312 and may be substantially the same as the memory card 1200 of FIG. 12A. The memory system 1310 stores data processed by the CPU 1330 or data inputted from an external source. The information processing system 1300 may be provided as a memory card, a solid state disk, a camera image sensor, and application chipsets of other information processing systems. As one example, the memory system 1310 may include a semiconductor disk device (SSD) and in this case, the information processing system 1300 stably and reliably stores a large capacity of data in the memory system 1310.

A semiconductor package according to an embodiment of the inventive concept may be packaged through various forms. The semiconductor package may be packaged through methods such as Package on Package (PoP), Ball Grid Arrays (BGAs), Chip Scale Packages (CSPs), Plastic Leaded Chip Carrier (PLCC), Plastic Dual In-Line Package (PDIP), Multi Chip Package (MCP), Wafer Level Package (WLP), Wafer-level Fabricated Package (WFP), Wafer-level Processed Stack Package (WSP), Die On Waffle Package, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Package and System In Package (SIP).

According to embodiments of the inventive concept, since there is no need for a PCB and a bonding wire/a bump, a simplified structure may be realized and manufacturing costs are reduced. Furthermore, according to embodiments of the inventive concept, SJR is improved by enlarging a contact area between a solder ball and a metal line. As a result, mechanical and electrical characteristics of a semiconductor package are improved.

Although the present inventive concept has been described in connection with the embodiments of the present inventive concept illustrated in the accompanying drawings, it is not limited thereto. It will be apparent to those skilled in the art that various substitutions, modifications and changes may be made thereto without departing from the scope and spirit of the inventive concept.

What is claimed is:

1. A semiconductor package comprising:
   a semiconductor chip including a bonding pad;
   a conductive laser stop layer on the bonding pad;
   a metal line separated from the bonding pad by the conductive laser stop layer and indirectly electrically connected to the bonding pad through the conductive laser stop layer and having a contact portion contacting an external terminal;

a solder mask layer covering the metal line and having an opening defining the contact portion;
a molding layer on the semiconductor chip,
wherein the molding layer comprises a recess pattern exposing the conductive laser stop layer and extending from the conductive laser stop layer toward the contact portion; and
wherein the metal line is disposed in the recess pattern.

2. The semiconductor package of claim 1, wherein the molding layer comprises a transparent layer including silicon hybrid material or an opaque layer including epoxy material.

3. The semiconductor package of claim 1, wherein the molding layer comprises:
a molding substrate covering a top surface of the semiconductor chip; and
a bottom molding layer covering a bottom surface and sides of the semiconductor chip,
wherein the molding substrate comprises the recess pattern.

4. A semiconductor package comprising:
a semiconductor chip including a bonding pad;
a metal line electrically connected to the bonding pad and having a contact portion contacting an external terminal;
a solder mask layer covering the metal line and having an opening defining the contact portion; and
a molding layer on the semiconductor chip,
wherein the molding layer comprises a recess pattern exposing the bonding pad and extending from the bonding pad toward the contact portion,
wherein the metal line is disposed in the recess pattern to contact the bonding pad,
wherein the recess pattern comprises:
a vertical via hole exposing the bonding pad; and
a horizontal groove extending from the vertical via hole,
wherein the horizontal groove is recessed along a surface of the molding layer.

5. The semiconductor package of claim 4, wherein the metal line comprises:
a vertical pattern filling the via hole and electrically contacting the bonding pad; and
a horizontal pattern filling the horizontal groove and extending from the vertical pattern,
wherein the horizontal pattern electrically contacts the external terminal at the contact portion.

6. The semiconductor package of claim 5, wherein the semiconductor chip further comprises a metal layer between the vertical pattern and the bonding pad.

7. A semiconductor package comprising:
a semiconductor chip including a bonding pad;
a metal line electrically connected to the bonding pad and having a contact portion contacting an external terminal;
a solder mask layer covering the metal line and having an opening defining the contact portion;
a molding layer on the semiconductor chip, and
a sustain board coupled to the semiconductor chip,
wherein the molding layer comprises a recess pattern exposing the bonding pad and extending from the bonding pad toward the contact portion, and
wherein the metal line is disposed in the recess pattern to contact the bonding pad.

8. A semiconductor package comprising:
a semiconductor chip including a bonding pad;
a metal line electrically connected to the bonding pad and having a contact portion contacting an external terminal;
a solder mask layer covering the metal line and having an opening defining the contact portion; and
a molding layer on the semiconductor chip,
wherein the molding layer comprises a recess pattern exposing the bonding pad and extending from the bonding pad toward the contact portion,
wherein the metal line is disposed in the recess pattern to contact the bonding pad,
wherein the metal line includes a surface having a rougher texture than a surface of the molding layer.

9. The semiconductor package of claim 8, wherein a boundary surface between the contact portion and the external terminal is uneven.

10. A semiconductor package comprising:
a semiconductor chip including a plurality of bonding pads arranged in a column at or about a center portion of the semiconductor chip, the bonding pads having a respective conductive laser stop layer thereon, and a plurality of external terminals located at edge portions of the semiconductor chip;
a plurality of metal lines, each metal line being separated from a respective bonding pad by a respective conductive laser stop layer and respectively indirectly electrically connected between a bonding pad of the plurality of bonding pads through the respective conductive laser stop layer and an external terminal of the plurality of external terminals,
wherein a first group of the metal lines includes metal lines having at least one bent portion in a plan view, and a second group of the metal lines includes metal lines having a straight line configuration in a plan view;
a solder mask layer covering the metal lines and having a plurality of openings exposing respective contact portions on the metal lines contacting the external terminals; and
a molding layer on the semiconductor chip,
wherein the molding layer comprises a plurality of recess patterns exposing the conductive laser stop layers and extending from the conductive laser stop layers to the contact portions; and
wherein the metal lines are disposed in the recess patterns.

11. A semiconductor package comprising:
a semiconductor chip including a plurality of bonding pads arranged in a column at or about a center portion of the semiconductor chip, and a plurality of external terminals located at edge portions of the semiconductor chip;
a plurality of metal lines, each metal line being respectively electrically connected between a bonding pad of the plurality of bonding pads and an external terminal of the plurality of external terminals,
wherein a first group of the metal lines includes metal lines having at least one bent portion in a plan view, and a second group of the metal lines includes metal lines having a straight line configuration in a plan view;
a solder mask layer covering the metal lines and having a plurality of openings exposing respective contact portions on the metal lines contacting the external terminals; and
a molding layer on the semiconductor chip,
wherein the molding layer comprises a plurality of recess patterns exposing the bonding pads and extending from the bonding pads to the contact portions, and
wherein the metal lines are disposed in the recess patterns, and
wherein a recess pattern comprises:
a hole exposing the bonding pad and extending in a first direction into the molding layer; and
a groove extending from an upper portion of the hole in a second direction perpendicular to the first direction along a surface of the molding layer.

12. The semiconductor package of claim 11, wherein a metal line comprises:
- a first pattern filling the hole and electrically contacting the bonding pad; and
- a second pattern filling the groove and extending from the first pattern, wherein the second pattern electrically contacts an external terminal at a contact portion.

* * * * *